US010229920B1

(12) United States Patent
Cheng et al.

(10) Patent No.: US 10,229,920 B1
(45) Date of Patent: Mar. 12, 2019

(54) ONE-TIME PROGRAMMABLE VERTICAL FIELD-EFFECT TRANSISTOR

(71) Applicant: International Business Machines Corporation, Armonk, NY (US)

(72) Inventors: Kangguo Cheng, Schenectady, NY (US); Qintao Zhang, Mount Kisco, NY (US); Juntao Li, Cohoes, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/822,557

(22) Filed: Nov. 27, 2017

(51) Int. Cl.
| | |
|---|---|
| H01L 27/11 | (2006.01) |
| H01L 27/112 | (2006.01) |
| H01L 29/78 | (2006.01) |
| H01L 21/768 | (2006.01) |
| G11C 17/12 | (2006.01) |
| H01L 27/092 | (2006.01) |
| H01L 21/762 | (2006.01) |

(52) U.S. Cl.
CPC ........ H01L 27/11206 (2013.01); G11C 17/12 (2013.01); H01L 21/76831 (2013.01); H01L 27/0922 (2013.01); H01L 27/11226 (2013.01); H01L 27/11246 (2013.01); H01L 29/7802 (2013.01); H01L 21/76264 (2013.01)

(58) Field of Classification Search
CPC ......... H01L 27/11206; H01L 21/76831; H01L 27/0922; G11C 17/12
USPC .......................................................... 365/63
See application file for complete search history.

(56) References Cited

U.S. PATENT DOCUMENTS

| | | |
|---|---|---|
| 4,961,102 A | 10/1990 | Shideler et al. |
| 6,518,614 B1 | 2/2003 | Breitwisch et al. |
| 7,579,240 B2 | 8/2009 | Forbes |
| 8,350,316 B2 | 1/2013 | Lung et al. |
| 8,716,831 B2 | 5/2014 | Chen et al. |
| 8,773,881 B2 | 7/2014 | Shepard |
| 9,305,624 B2 | 4/2016 | Shepard |
| 9,589,970 B1 | 3/2017 | Tseng et al. |
| 9,893,207 B1 * | 2/2018 | Balakrishnan ...... H01L 29/7889 |
| 2013/0193400 A1 * | 8/2013 | Sandhu ............... H01L 27/2454 257/5 |

* cited by examiner

*Primary Examiner* — Anthan Tran
(74) *Attorney, Agent, or Firm* — Stosch Sabo

(57) ABSTRACT

A one-time programmable (OTP) vertical field-effect transistor (VFET) can be fabricated on the top surface of an integrated circuit (IC) substrate having a fin. A doped layer can be deposited onto the top surface to create an OTP VFET drain. A dielectric layer can be formed onto side surfaces of the fin, and a gate dielectric layer formed onto side surfaces of the dielectric layer. A metal layer formed onto side surfaces of the gate dielectric layer can create an OTP VFET gate. An electrically insulative top spacer layer can then be attached to top edges of the dielectric, the gate dielectric layer, and the metal layer. A doped structure formed onto the top surface of the fin can create an OTP VFET source. A voltage applied to a portion of the gate dielectric layer can cause dielectric breakdown, which can be used to store a data value.

20 Claims, 11 Drawing Sheets

ONE-TIME PROGRAMMABLE VERTICAL FIELD-EFFECT TRANSISTOR

BACKGROUND

The present disclosure generally relates to vertical field-effect transistor (VFET) fabricated on an integrated circuit (IC). In particular, this disclosure relates to the formation of a one-time programmable (OTP) VFET that can be fabricated using existing VFET process operations.

An IC, also known as a "microchip," silicon or computer "chip," is a specially prepared piece of silicon, or other semiconductor material, into which a complex electronic circuit is etched and formed using a photolithographic process. IC types can include computer processors, memory, analog, and customizable devices. ICs can be relatively fragile, and therefore are often mounted on and/or surrounded by a protective, supportive ceramic or plastic package. Electrical connections to the chip can be provided through metal contacts, which can include pins or solder balls located on the exterior of the chip package.

ICs can have certain advantages over comparable discrete circuits, such as relatively low-cost and high-performance. The cost of an IC can be relatively low, resulting from the large number, e.g., millions, of transistors that can be simultaneously printed as a complete functional unit by photolithographic techniques, rather than constructing an equivalent circuit from individually fabricated transistors. Performance of an IC can be significantly higher than an equivalent discrete circuit, due to the high density and relatively low electrical interconnect parasitics between active devices such as transistors. Types of ICs may include analog, digital and "mixed signal" chips, i.e., chips that incorporate both analog and digital functions on the same silicon die.

Semiconductor memory devices or chips can be used in computers and other electronic systems to electronically store data. For example, instructions for a processor circuit and data processed by the processor circuit can both be stored in semiconductor memory chips. Such memory chips may be fabricated using a variety of semiconductor technologies. The time to access all data locations within a semiconductor memory chip is generally uniform, which can result in efficient storage and retrieval of data from any data location within the chip. Semiconductor memory chips can be "volatile" or "non-volatile" with regards to data retention during interruption of electrical power supplied to a chip. A volatile memory chip can lose data when the power supplied to the chip is interrupted, and a non-volatile chip is designed to retain data during power supply interruptions.

SUMMARY

Embodiments may be directed towards a one-time programmable (OTP) vertical field-effect transistor (VFET), formed on an integrated circuit (IC) substrate. The OTP VFET can include a fin extending away from a top surface of the IC substrate in a direction normal to the top surface of the IC substrate and a doped layer attached to the top surface of the IC substrate, a portion of the doped layer being in electrically conductive contact with the fin and forming a drain of the OTP VFET. The OTP VFET can also include a dielectric layer formed onto side surfaces of the fin, bottom edges of the dielectric layer being vertically adjacent to first portions of a top surface of the doped layer and a gate dielectric layer having vertical portions formed onto side surfaces of the dielectric layer, the gate dielectric layer further having horizontal portions formed onto second portions of the top surface of the doped layer that are horizontally adjacent to the first portions of the top surface of the doped layer. The OTP VFET can also include a metal layer formed onto top surfaces of the horizontal portions of the gate dielectric layer and onto side surfaces of the vertical portions of the gate dielectric layer, at least a portion of the metal layer forming a gate of the OTP VFET. The OTP VFET can also include an electrically insulative top spacer layer formed onto top edges of the dielectric layer, of the vertical portions of the gate dielectric layer, and of the metal layer, a top surface of the top spacer layer being coplanar with a top surface of the fin and a doped structure formed onto and in electrically conductive contact with the top surface of the fin, the doped structure forming a source of the OTP VFET.

Embodiments may also be directed towards a method for fabricating, on IC substrate having a fin that extends away from a top surface of the IC substrate in a direction normal to the top surface of the IC substrate, an OTP VFET. The method can include forming, on the top surface of the IC substrate, a drain of the OTP VFET by depositing a doped layer, a portion of the doped layer in electrically conductive contact with the fin and depositing a dielectric layer onto side surfaces of the fin, bottom edges of the dielectric layer being vertically adjacent to first portions of a top surface of the doped layer. The method can also include forming a gate dielectric layer by depositing vertical portions of gate dielectric material onto side surfaces of the dielectric layer and by depositing horizontal portions of gate dielectric material onto second portions of the top surface of the doped layer that are horizontally adjacent to the first portions of the top surface of the doped layer. The method can also include forming a gate of the OTP VFET by depositing a metal layer onto top surfaces of the horizontal portions of the gate dielectric layer and onto side surfaces of the vertical portions of the gate dielectric layer. The method can also include forming an electrically insulative top spacer layer onto top edges of the dielectric layer, of the vertical portion of the gate dielectric layer, and of the metal layer, a top surface of the top spacer layer being coplanar with a top surface of the fin and creating a source of the OTP VFET by forming a doped structure onto and in electrically conductive contact with the top surface of the fin.

Embodiments may also be directed towards a method for fabricating, on an IC substrate having a fin that extends away from a top surface of the IC substrate in a direction normal to the top surface of the IC substrate, an OTP VFET. The method can include forming, on the top surface of the IC substrate, a drain of the OTP VFET by depositing a doped layer, a portion of the doped layer in electrically conductive contact with the fin and depositing, on a top surface of the doped layer, an electrically insulative bottom spacer layer. The method can also include forming a dielectric layer by depositing horizontal portions of the dielectric layer onto a top surface of the bottom spacer layer and by depositing vertical portions of the dielectric layer onto side surfaces of the fin. The method can also include creating sacrificial spacers by depositing sacrificial spacer material onto side surfaces of the dielectric layer, bottom edges of the sacrificial spacers being vertically adjacent to first portions of a top surface of the dielectric layer. The method can also include removing portions of the dielectric layer and of the bottom spacer layer that are outside of an area defined on the doped layer by a combined footprint of the sacrificial spacers and of the vertical portions of the dielectric layer and removing the sacrificial spacers from the side surfaces of the dielectric layer. The method can also include forming horizontal portions of a gate dielectric layer by depositing gate dielectric material onto top surfaces of the horizontal portions of the dielectric layer and onto the top surface of the doped layer and forming vertical portions of the gate dielectric layer by depositing the gate dielectric material onto side surfaces of the bottom spacer layer and onto side surfaces of the dielectric layer. The method can also include forming a gate of the OTP VFET by depositing a metal layer onto top surfaces of the horizontal portions of the gate dielectric layer and onto side surfaces of the vertical portions of the gate dielectric layer. The method can also include forming an electrically insulative top spacer layer onto top edges of the dielectric layer, of at least one of the vertical portions of the gate dielectric layer, and of the metal layer, a top surface of the top spacer layer being coplanar with a top surface of the fin. The method can also include creating a source of the OTP VFET by forming a doped structure onto and in electrically conductive contact with the top surface of the fin.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
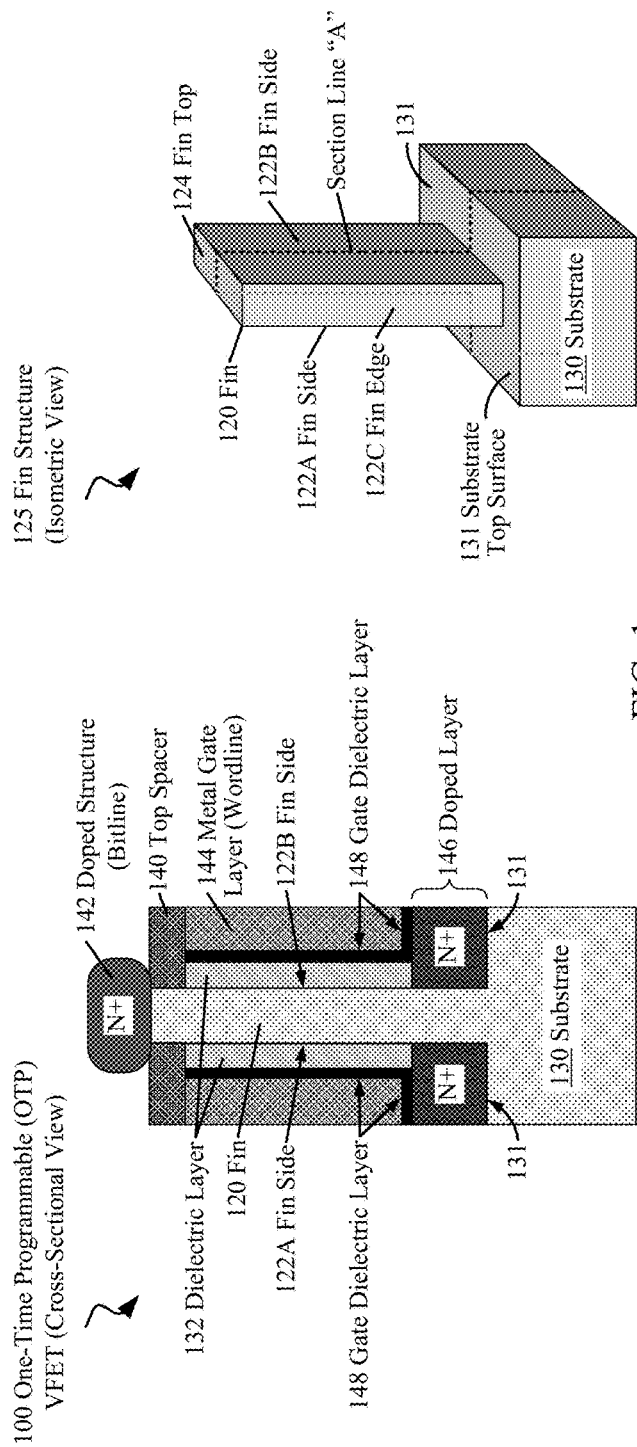
FIG. 1 includes a cross-sectional view of a one-time programmable (OTP) vertical field-effect transistor (VFET), an isometric view of a corresponding fin structure and a table of example voltages applied in OTP programming and read operations, according to embodiments of the present disclosure.
Figure 1:
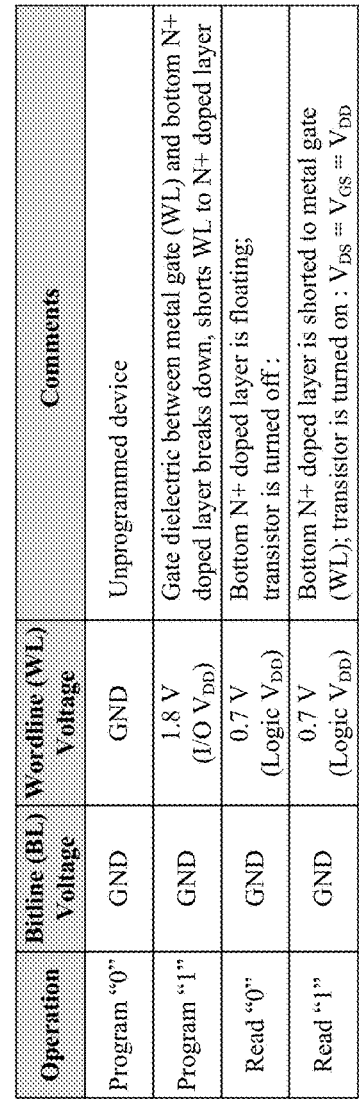

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing one-time programmable (OTP) vertical field-effect transistors (VFETs) useful as data storage elements within integrated circuits (ICs). Such ICs can include processors, logic, and special-purpose chips. Such OTP VFETs can result in enhanced IC performance and reduced electronic system cost.

Such ICs may be used to provide high-performance and high-reliability data processing capability for electronic devices including computing systems and servers. Such computing systems may include, but are not limited to, web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing high-performance and high-reliability data processing capability to electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards providing high-performance and high-reliability data processing capability to consumer electronic devices such as cell phones, tablets, personal computers and Internet routing devices.

It can be understood that a VFET, also known as a "fin field-effect transistor" or "FinFET" is a field-effect transistor fabricated on a vertical fin that is formed on a top surface of a semiconductor substrate. Embodiments of the present disclosure are directed towards an OTP VFET, which may be programmed to hold either a logical "0" or logical "1" data value. For ease of discussion hereinafter, the terms "OTP," "OTP VFET," and "OTP device" and may be used interchangeably hereinafter, without loss of meaning, to refer to an OTP VFET. A non-programmable vertical field-effect transistor will be generally referred to as a "VFET."

For simplicity of discussion, the terms "doped structure," "bitline," and "BL" are used interchangeably herein in reference to a heavily doped structure that serves as an OTP source terminal, which may be used as a bitline within an array of interconnected OTP devices. A consistent heavily doped structure can serve as a source terminal for a similarly constructed VFET device. Similarly, the terms "metal gate," "metal gate layer," "wordline," and "WL" can be used interchangeably herein in reference to a metal layer that serves as an OTP gate terminal, which may be used as a wordline in an array of interconnected OTP devices. A consistent metal layer can serve as a gate terminal for a similarly constructed VFET device. The terms "doped layer," and "drain" can also be used interchangeably herein in reference to a portion of a heavily doped layer that serves as an OTP drain terminal. A consistent portion of a heavily doped layer can serve as a drain terminal for a similarly constructed VFET device.

Embodiments can provide an apparatus and methods for integrating OTP devices into ICs that include VFETs. Such OTP devices can provide permanent, non-volatile data storage on an IC such as a processor or logic chip, without requiring expensive, complicated additional technology and/or materials and fabrication processes. OTP memory device structures share a majority of semiconductor features and process operations with those of VFET devices. Such IC data storage can be realized through the use of existing and proven IC design and fabrication technologies. ICs including embodiments of the present disclosure can be used within existing electronic systems such as servers, high-performance computers, personal computers and consumer electronic devices such as cell phones and tablets.

From the introduction of the IC and throughout the long history of IC fabrication process development, active devices, e.g., field-effect transistors (FETs), of ICs have been fabricated within a planar layer of a semiconductor substrate such as silicon. Fabrication process improvements have enabled each successive generation of ICs to feature smaller, denser and faster active devices than previous IC generations, resulting in corresponding IC performance improvements. Process improvements such as the downward scaling of device geometries, the use of new and innovative materials, fabrication processes and lithography equipment have generally been adequate to compensate for performance limitations resulting from reduced device geometries.

As critical features, e.g., gate lengths, of active devices such as FETs have reached dimensions far less than 1 μm, e.g., 22 nm and 14 nm, however, certain active device characteristics have resulted in pronounced performance-limiting behaviors. For example, static current leakage between the drain and source terminals of FETs has increased dramatically as the size of the FETs has been reduced. Planar devices with gate lengths of 14 nm, for instance, can have static current leakage that consumes a large proportion of an IC's total current supply budget. Supply current that is wasted, i.e., leaked and dissipated as heat, is not available to the IC to enhance performance through device switching. Such excess supply current leakage can also complicate power supply, cooling, and other design issues, and can account for a significant portion of the effort put into the design of planar ICs.

Such performance-limiting active device behaviors have motivated IC designers to innovate and develop non-planar IC devices and technologies including VFETS, also known as FinFETs. VFET devices can have similar operating characteristics as planar FETs, however with greatly improved current modulation capability relative to planar FETs having comparable geometries. This improved current modulation generally results in greatly reduced static current leakage and corresponding reduced overall IC power consumption. Accordingly, VFET devices are being developed as a potential option to scale complementary metal-oxide semiconductor (CMOS) and silicon on insulator (SOI) circuit technology to device sizes with critical dimensions less than 5 nm.

VFETS can be interconnected into various types of static and dynamic memory cells/devices by using circuit topologies similar to those used to interconnect planar FETs. For example, VFETS can be wired together to create static random-access memory (SRAM) and dynamic random-access memory (DRAM) memory cells, which can be further interconnected to create static or dynamic memory arrays on an IC. While such memory devices are useful for containing data used during the operation of an IC, e.g., a processor circuit, SRAM and DRAM memory cells lose the data stored within them when the IC power supply is removed or turned off.

Certain IC functions can benefit from the non-volatile and permanent storage of data, i.e., data that is not lost upon power-down of the IC. As one example, an ID or serial number of an IC can be stored within the IC and can be subsequently read by a system controller device or software such as a hypervisor. The system controller device/software can subsequently use the ID to identify the IC and/or particular characteristics of the IC such as maximum clock frequency or non-functional sections of the IC. The system controller device can then make adjustments to the system operating characteristics and configuration in response to the data read from the IC.

As another example, machine-executable code such as firmware or microcode can be stored in permanent, non-volatile memory of a processor IC and subsequently executed, by the processor IC, during a processor boot-up sequence. Such a sequence can be executed without the processor IC having to read stored instructions from an externally connected chip or data storage device. Storing such data on an IC that executes it can be useful in increasing the overall performance and reducing the overall cost of such an electronic system.

Certain figures herein show only a single OTP VFET; however, embodiments may include a plurality e.g., an array, of OTP VFET, fabricated on the same IC substrate. In some embodiments, multiple OTP VFETs may be electrically interconnected to create high-capacity OTP memory devices, which may be useful for storing data such as a specific chip ID, or a section of microcode/firmware within the IC. While all figures herein illustrate the principles and features of the present disclosure, they are not necessarily drawn to scale.

Certain embodiments are directed towards to an OTP VFET, formed on an IC substrate. Such an OTP VFET can be configured to provide non-volatile, permanent data storage capability to enhance the functionality of an IC including non-planar active devices such as VFETs/FinFETs. FIG. 1 includes a cross-sectional view 100 of an OTP VFET, a corresponding isometric view 125 of a fin structure and a table 150 of example voltages applied in OTP programming and read operations, according to embodiments of the present disclosure.

Cross-sectional view 100 can be useful for illustrating the structure of and materials used to create an OTP VFET, according to embodiments. According to embodiments, view 100 depicts an OTP device similar in operation to a planar N-channel field-effect transistor (NFET) device. The upper doped structure 142 functions as a bitline or source terminal, fin 120 can function as a channel, a metal layer 144 functions as gate/wordline, and the bottom doped layer 146 can function as drain or remain floating. The dielectric layer 132 and gate dielectric layer 148 serve to insulate the metal layer 144 from the fin 120. View 100 depicts an OTP VFET, formed on an IC substrate 130 upon which a fin 120 is formed. According to embodiments, fin 120 extends away from the top surface 131 of the IC substrate 130 in a direction normal to the top surface 131. In some embodiments, the fin 120 can be a lightly doped, e.g., either "P−" or "N−" semiconductor, that includes dopants in a concentration less than $1.0 \times 10^{17}$ cm$^{-3}$. In some embodiments, the fin 120 can be an undoped semiconductor.

In embodiments, a doped layer 146 is attached to the top surface 131 of the IC substrate 130. A portion of the doped layer 146 is in electrically conductive contact with the fin 120 and can serve as a drain terminal of the OTP VFET. According to embodiments, doped layer 146 can be a heavily doped "P+" or "N+" layer, including p-type or n-type dopants in a concentration greater than $1.0 \times 10^{18}$ cm$^{-3}$. In some embodiments, doped layer 146 can be an epitaxial layer.

According to embodiments, dielectric layer 132 is formed onto side surfaces 122A, 122B of the fin 120. Bottom edges of the dielectric layer 132 are vertically adjacent to, i.e., in contact with, part of the top surface of the doped layer 146. As a non-limiting example, in some embodiments, dielectric layer 132 can be a thick oxide layer, formed through a thermal oxidation process. Dielectric layer 132 can be fabricated, for instance, from a material such as silicon dioxide, and can have a thickness in a range between 1.5 nm and 5.0 nm. The presence of dielectric layer 132 that is relatively thick in comparison to gate dielectric layer 148 can be useful in preventing dielectric breakdown of either dielectric layer 132 or gate dielectric layer 148 along the along side surfaces 122A and 122B of fin 120. The thickness, dielectric constant and voltage breakdown characteristics of dielectric layer 132 can be selected in order to ensure that the breakdown voltage of dielectric layer 132 is significantly greater than the breakdown voltage of gate dielectric layer 148.

According to embodiments, a gate dielectric layer 148 is formed vertically onto the side surfaces of the dielectric layer 132 and horizontally onto portions of the top surface of the doped layer 146, adjacent to the dielectric layer 132. A relatively small portion of gate dielectric layer 148, located between the bottom edge of metal gate (wordline) 144 and a top surface of doped layer 146 can be useful as a "dielectric breakdown area." A dielectric breakdown of such an area can result in increased electrical conductivity through the dielectric layer 148, which can be used as a programmable element for storing a data bit.

According to embodiments, the gate dielectric layer 148 can include "high-k" dielectric materials, which can generally have dielectric constants greater than the relative dielectric constant of silicon dioxide, i.e., 3.9. According to embodiments, the gate dielectric layer 148 can formed from materials including, but not limited to hafnium oxide, hafnium silicon oxide, hafnium silicon oxynitride, lanthanum oxide, lanthanum aluminum oxide, zirconium oxide, zirconium silicon oxide, zirconium silicon oxynitride, silicon nitride and silicon dioxide. According to embodiments, the selected thickness of at least one of the horizontal portions of the gate dielectric layer 148 can be in a range between 1.5 nm and 3.0 nm.

In embodiments, a metal gate layer 144 is formed horizontally onto portions of the gate dielectric layer 148 and vertically onto the side surfaces of the gate dielectric layer 148. The metal layer 144 is useful in functioning as a gate/wordline (WL) of the OTP VFET. According to embodiments, an electrically insulative top spacer 140 layer can be formed onto top edges of the dielectric layer 132, of the vertical portions of the gate dielectric layer 148, and of the metal layer 144. The top spacer 140 layer can be formed so that a top surface of the top spacer 140 layer is coplanar with a top surface of the fin 120.

According to embodiments, a doped structure (bitline) 142 is formed onto and in electrically conductive contact with the top surface of the fin 120. The doped structure 142 can serve as a source terminal of the OTP VFET and can be used as a bitline (BL) when the OTP VFET is arranged and interconnected within an array of similar OTP VFETs. According to embodiments, doped structure 142 can be a heavily doped P+ or N+ layer, including p-type or n-type dopants in a concentration greater than $1.0 \times 10^{18}$ cm$^{-3}$. In some embodiments, doped structure 142 can be an epitaxial layer.

It can be understood that dielectric layer 132, gate dielectric layer 148, and metal gate layer 144 can be formed in such a way as to "wrap around" or cover multiple sides, e.g., 122A, 122B, and edges, e.g., 122C, of fin 120. According to embodiments, layers 132, 148 and 144 can be formed on two, three or four sides/edges of fin 120. It can be understood that each of the layers 132, 148 and 144 can each be a single physically and electrically contiguous structure, wrapped around multiple sides/edges of fin 120.

Isometric view 125 of a fin structure can be useful in providing a visual understanding of the three-dimensional structural features of a fin used in fabricating both a VFET as well as an OTP VFET, according to embodiments. View 125 can be particularly useful in illustrating fin sides 122A and 122B, fin edge 122C, fin top 124, and substrate top surface 131, which may be more difficult to visualize with consistent cross-sectional views, e.g., view 100. For ease of illustration, the other figures herein that detail OTP structure and fabrication operations provide cross-sectional views of the OTP. Such cross-sectional views generally correspond to a cross section of fin 120, view 125, taken along section line "A." Cross-sectional figures may also include layers deposited on the fin 120, such as dielectric layer 132, gate dielectric layer 148, metal gate (wordline) 144, top spacer 140 and doped structure (bitline) 142. It can be understood that features included within view 125, particularly the substrate top surface 131 of fin structure 125 are not drawn to scale, but rather serve to illustrate features and principles of the present disclosure.

Table 150 can be useful for detailing OTP program and read operations, the voltages used in those operations, and results of the operations performed on an OTP device. The program and read operations detailed in table 150 can be performed on an individual OTP device, or an arrangement, such as an array, of interconnected OTP devices that are fabricated on a single IC substrate. Circuits such as row and column selection circuits, consistent with those used to write data into and read data from other types of array-organized memory cells, can be used for these purposes. Such circuits can be configured to both apply various read and write voltage levels to the memory cells as well as read voltages and/or currents which may result from the application of such voltages.

OTP devices are each fabricated into an "unprogrammed" state. The doped layer 146 of an OTP device, e.g., 100, that has not been programmed through the application of a programming voltage remains "floating," i.e., electrically disconnected from metal gate layer (wordline) 144. Such an "unprogrammed" OTP device state is used, according to embodiments, to represent a logical "0" data state. In accordance with Table 150, both OTP device programming and read operations involve electrically interconnecting the bitline (BL) 142 to ground (GND) while applying various voltage levels to the wordline (WL) 144. Because the logical state represented by an "unprogrammed" or "fresh" OTP device is a logical "0," no particular programming operation is necessary. In accordance with table 150, however, a wordline voltage of "GND" is listed for completeness. In a programming scenario including the sequential application of wordline programming voltages to each OTP device of a sequence of OTP devices, "programming" a logical "0" into a particular OTP device could be accomplished by simply maintaining the wordline voltage at GND.

In accordance with Table 150, programming a logical "1" into an OTP device can be accomplished by applying a programming voltage, e.g., 1.8 V, to the wordline 144, while maintaining the bitline voltage at GND. According to embodiments, a specified programming voltage can be in a range between 1.0 V and 3.0 V. In some embodiments, the programming voltage may correspond to an I/O supply voltage, e.g., 1.8 V, that is greater than a logic circuit supply voltage, e.g., 0.7 V. In response to the application of the programming voltage to the wordline 144, the gate dielectric layer 148 located between the wordline 144 and the doped layer 146 experiences dielectric breakdown, causing a substantial increase in conductivity between the wordline 144 and the doped layer 146. This permanent, non-volatile physical and electrical change to the gate dielectric 148 can be useful as a data storage mechanism; an OTP device that has experienced dielectric breakdown subsequently represents a stored logical "1" data value. The increase in conductivity between the wordline 144 and the doped layer 146 causes them to be permanently electrically connected with a relatively low resistance connection.

The vertical transistor structure, i.e., source 142, fin 120 acting as a channel, and drain 646B of an OTP device programmed to store a logical "1" data value through dielectric breakdown of gate dielectric layer 148, as depicted in view 250, can be useful in constraining on-state current flow through the OTP VFET to a limited value. Without intrinsic current limitations imposed by the vertical transistor structure, a very high short-circuit current between the metal gate 144 and the drain 646B could result from the relatively low resistance of the dielectric breakdown area 152 of gate dielectric layer 148. A high short-circuit current could result in excess current/heat dissipation and corresponding chip thermal problems. Current limitations imposed by the vertical transistor structure can be useful in preventing such excess current/power dissipation problems.

An OTP read operation includes applying a read voltage, e.g., 0.7 V, to the wordline 144 (gate) while holding the bitline 142 (source) of the OTP to GND. In response to the application of a read voltage, an OTP device that has not been programmed to represent a logical "1" state remains turned off; the portion of the doped layer 146 adjacent to the gate dielectric layer 148 (drain) remain "floating" or electrically disconnected from the wordline 144. As a result, appreciable current does flow between the source of the OTP and the drain of the OTP. A sense circuit interconnected to the OTP device can be designed to detect that no current is flowing between the source and the drain, and thus that the OTP represents a logical "0" data value.

In response to the application of a read voltage, e.g., 0.7 V, an OTP device that has been programmed to represent a logical "1" state is turned on; the drain 146 is permanently electrically connected to the wordline 144 through a conductive dielectric breakdown area of gate dielectric layer 148. As a result, appreciable current is allowed to flow between the source 142 of the OTP and the drain 146 of the OTP. A sense circuit interconnected to the OTP device 100 can be designed to detect that appreciable current is flowing between the source 142 and the drain 146, and thus that the OTP represents a logical "1" data value.

A variety of physical dimensions, e.g., thickness, width and height, as well as various material properties, e.g., dielectric constants of the dielectric layer and the gate dielectric layer, can be specified, in embodiments, to create OTP devices having a wide range of performance characteristics and/or data storage capacities. For example, in certain applications, embodiments of OTP devices can have either relatively high or relatively low programming voltages, and can have a wide range of data storage capacities ranging from a single or few bits, to several MB.

In embodiments, OTP devices can be created by using existing and proven materials, design techniques and semiconductor fabrication technologies. According to embodiments, an IC constructed with OTP devices can be compliant with existing and proven IC manufacturing processes and material sets. Fabricating OTP devices on dielectric layers of an IC can be particularly useful as a cost-effective way to add electrically accessible, high-density data storage capacity to new or existing IC designs. FIG. 1 depicts an example embodiment of a single VFET on an IC. Some embodiments may include additional VFETs, formed in various arrangements such as an array of VFETs.

Figure 2:
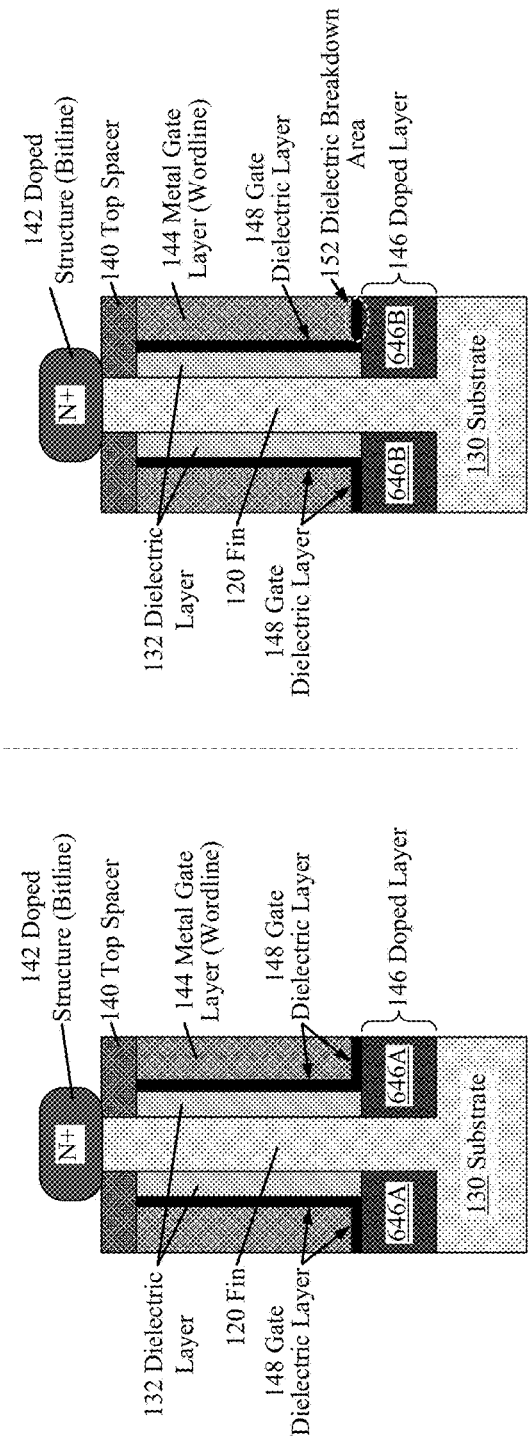
FIG. 2 includes two views each including associated schematic and cross-sectional diagrams depicting OTP VFET in "0" and "1" logic states, according to embodiments consistent with the figures.

FIG. 2 includes two views 200 and 250, each including associated schematic and cross-sectional diagrams depicting OTP VFETs representing logical "0" and "1" data states, respectively, according to embodiments consistent with the figures. The views 200 and 250 can be useful in depicting and enabling an understanding of differences in schematic interconnections of OTP device terminals corresponding to physical/electrical changes/interconnection of OTP material layers. According to embodiments, such physical/electrical changes within the OTP device can result from a programming operation, and can be used as a mechanism to store a data value within the OTP. The OTP physical structures/layers and functions thereof depicted in FIG. 2 are generally consistent with those depicted in FIG. 1.

The OTP cross-sectional physical depiction included in view 200 represents an OTP device that has not been programmed, thus representing a logic "0" data state. The structures 130, 146, 120, 132, 148, 144, 140 and 142 included in this depiction are consistent with those depicted and described in FIG. 1 and in the associated text. The OTP depicted includes a "floating" drain terminal 146A that is electrically disconnected and isolated from the metal gate/wordline 144 through a lack of dielectric breakdown area in the gate dielectric layer 148. This lack of interconnection between drain terminal 146A and metal gate/wordline 144 is also represented in the associated schematic view. In this "unprogrammed" logic "0" data state, the OTP device remains turned off when a read voltage is applied to the gate (wordline) terminal, which can be detected by a sense circuit interconnected to the OTP device.

The OTP cross-sectional physical depiction included in view 250 represents an OTP device that has been programmed, thus representing a logic "1" data state. The structures 130, 146, 120, 132, 148, 144, 140 and 142 included in this depiction are consistent with those depicted and described in FIG. 1 and in the associated text. The OTP depicted includes a "shorted" drain terminal 146B that is electrically interconnected to the metal gate/wordline 144 through a dielectric breakdown area 152 in the gate dielectric layer 148. This interconnection between drain terminal 146B and metal gate/wordline 144 is also represented in the associated schematic view. In this "programmed" logic "1" data state, the OTP device remains turns on in response to a read voltage applied to the gate (wordline) terminal, which can be detected by a sense circuit interconnected to the OTP device.

The OTP physical structure depicted in view 250 includes dielectric layer 132 and gate dielectric layer 148 located between fin 120 and metal gate layer (wordline) 144, which can be useful in preventing dielectric breakdown along sides of fin 120. Dielectric breakdown area 152, however, is a relatively limited area where only a portion of the dielectric layer 148 separates the metal gate layer (wordline) 144 from drain 146B. In response to the application of a specified programming voltage to metal gate layer (wordline) 144, the dielectric layer 148 in the dielectric breakdown area 152 can experience a physical and electrical transformation i.e., dielectric breakdown. Dielectric breakdown can significantly increase the electrical conductivity of the gate dielectric layer 148 within the dielectric breakdown area 152. According to embodiments, the electrical conductivity of the dielectric layer 148 within the dielectric breakdown area 152 can increase by at least a factor of 10 in response to the application of the specified programming voltage. Constraining the area of dielectric breakdown to dielectric breakdown area 152 can be useful for causing dielectric breakdown characteristics, e.g., the increase in conductivity, to be more controllable and repeatable than having a breakdown area located in one of several areas along the side of the fin 120. According to embodiments, the dielectric breakdown area 152 can have an area in a range between 500 nm$^2$ and 1000 nm$^2$. In some embodiments, dielectric breakdown area 152 can be limited to a region of gate dielectric layer 148 adjacent to one side or edge of fin 120, as depicted in view 250, FIG. 2. In some embodiments dielectric breakdown area 152 can include regions of gate dielectric layer 148 adjacent to two or more sides or edges of fin 120. According to embodiments, the specified programming voltage can be within a range between 1.0 V and 3.0 V. In embodiments, the specified programming voltage can be, for example, a voltage used to supply power to I/O circuits, e.g., 1.8 V.

According to embodiments, the gate dielectric layer 148 can include materials including, but not limited to, hafnium oxide, hafnium silicon oxide, hafnium silicon oxynitride, lanthanum oxide, lanthanum aluminum oxide, zirconium oxide, zirconium silicon oxide, zirconium silicon oxynitride, silicon nitride and silicon dioxide. The horizontal portion of the gate dielectric layer 148 can have a thickness selected in order to enable a conductivity increase by at least a factor of 10 in response to the application of the specified programming voltage. For example, according to embodiments, the selected thickness of the horizontal portion of the gate dielectric layer can be in a range between 1.5 and 3.0 nm.

Figure 3:
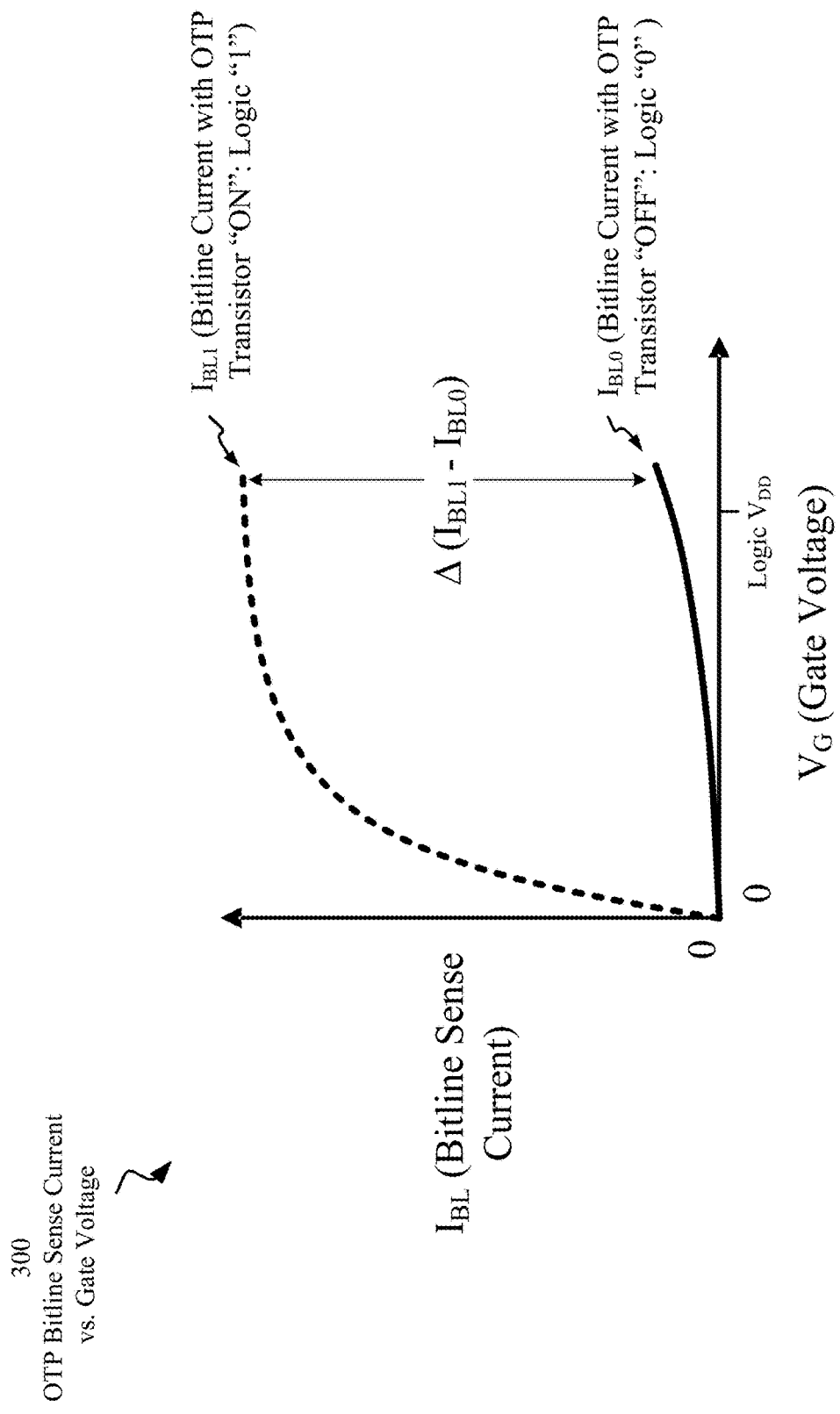
FIG. 3 is a graph depicting OTP bitline sense current vs. gate voltage curves for an OTP sense operation, according to embodiments consistent with the figures.

FIG. 3 includes a graph 300 depicting OTP bitline sense current ($I_{BL}$) vs. gate voltage ($V_G$) curves for an OTP sense operation, according to embodiments consistent with the figures. FIG. 3 can be useful in providing an understanding of the differences between bitline sense currents ($I_{BL}$), over a range of gate voltages ($V_G$), for an OTP device that represents a logic "0" data state versus an OTP device programmed to represent a logic "1" data state.

The curve labeled "$I_{BL1}$" represents bitline sense current for an OTP device that has been programmed to represent a logic "1" data state. Consistent with the descriptions provided in reference to FIG. 1 and FIG. 2, an OTP device programmed to represent a logic "1" data value turns on in response to the application of a sense voltage, e.g., 0.7 V, applied to the metal gate/wordline terminal of the device. The "$I_{BL1}$" curve of FIG. 3 depicts a relative rapid increase in $I_{BL}$ as gate voltage ($V_G$) is increased from 0.0 V to a Logic $V_{DD}$ voltage, e.g., 0.7 V. As an example, for a 14 nm VFET/OTP technology node, $I_{BL1}$ may be approximately 100 uA at $V_G$=Logic $V_{DD}$=0.7 V. A current of such magnitude can be easily sensed and converted into a logical "1" signal value by an appropriately designed sense circuit. Embodiments can be useful in limiting the on-state current of a VFET/OTP to the value of $I_{BL1}$, as discussed above.

The curve labeled "$I_{BL0}$" similarly represents bitline sense current for an OTP device that represents a logic "0" data state. Consistent with the descriptions provided in reference to FIG. 1 and FIG. 2, an OTP device representing a logic "0" remains turned off in response to the application of a sense voltage, e.g., 0.7 V, applied to the metal gate/wordline terminal of the device. The "$I_{BL0}$" curve of FIG. 3 depicts an insignificant increase in $I_{BL}$ as gate voltage ($V_G$) is increased from 0.0 V to a Logic $V_{DD}$ voltage, e.g., 0.7 V. This increase is attributed solely to leakage current between the OTP drain and source terminals. As an example, for a 14 nm VFET/OTP technology node, $I_{BL0}$ may be less than 0.05 µA at $V_G$=Logic $V_{DD}$=0.7 V. A current of such small magnitude can be easily sensed and converted into a logical "0" signal value by an appropriately designed sense circuit. According to embodiments, the difference between $I_{BL0}$ and $I_{BL1}$ at $V_G$=Logic $V_{DD}$=0.7 V can be several orders of magnitude.

Figure 4:
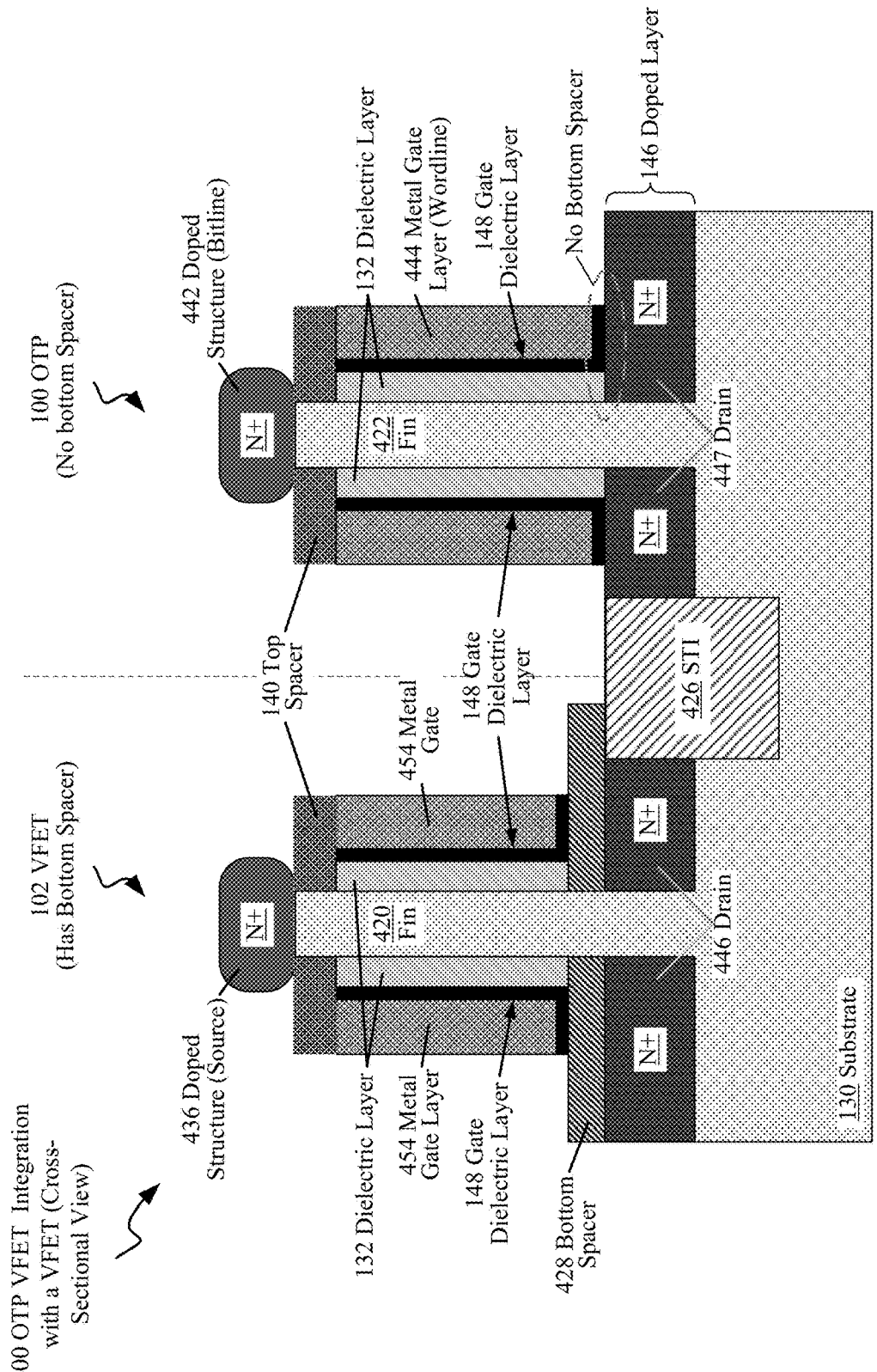
FIG. 4 is a cross-sectional view depicting the integration of an OTP VFET with a VFET, according to embodiments consistent with the figures.

FIG. 4 is a cross-sectional view depicting the integration of an OTP VFET 100 with a VFET 102 on the same IC substrate 130, according to embodiments consistent with the figures. FIG. 4 can be useful in providing an understanding of the structural differences between a VFET 102 and an OTP device 100, as well as illustrating the simplicity of fabricating both an OTP and a VFET on the same substrate, due to their structural similarities. The structures depicted, including substrate 130, drains 446 and 447, doped layer 146, STI 426, fin 422, dielectric layer 132, gate dielectric layer 148, metal gates/wordline 444 and 454, top spacer 140, and doped structure (bitline) 442 and 436, are generally consistent with those depicted and described in FIG. 1, FIG. 2 and described in the associated text.

According to embodiments, a consistent set of process operations may be used to fabricate both a VFET and an OTP VFET on the same IC substrate. As depicted in FIG. 4, the only significant structural difference between a VFET 102 and an OTP 100 fabricated on the same IC substrate can be bottom spacer layer 428. VFET 102 includes the bottom spacer layer 428, positioned on a top surface of doped layer 146 and below dielectric layer 132 and gate oxide layer 146. Such a bottom spacer layer 428 is absent in the corresponding OTP device 100. Bottom spacer layer 428 can be useful for providing electrical isolation, between the gate dielectric layer 148 and the drain 446 in the VFET 102, while its absence in OTP 100 allows for the creation of a dielectric breakdown area 152, FIG. 2, which is used to provide permanent data storage capability to the OTP 100.

This relatively minor structural difference between VFET 102 and an OTP 100 allows for a consistent set of process operations to be used to form both devices on the same substrate, which can be particularly useful in managing IC design and fabrication process complexity, materials selection, wafer processing time and cost. According to embodiments, both VFETs and OTP devices can be fabricated on the same IC substrate or wafer a using existing and proven process operations sequences and materials.

Figure 5:
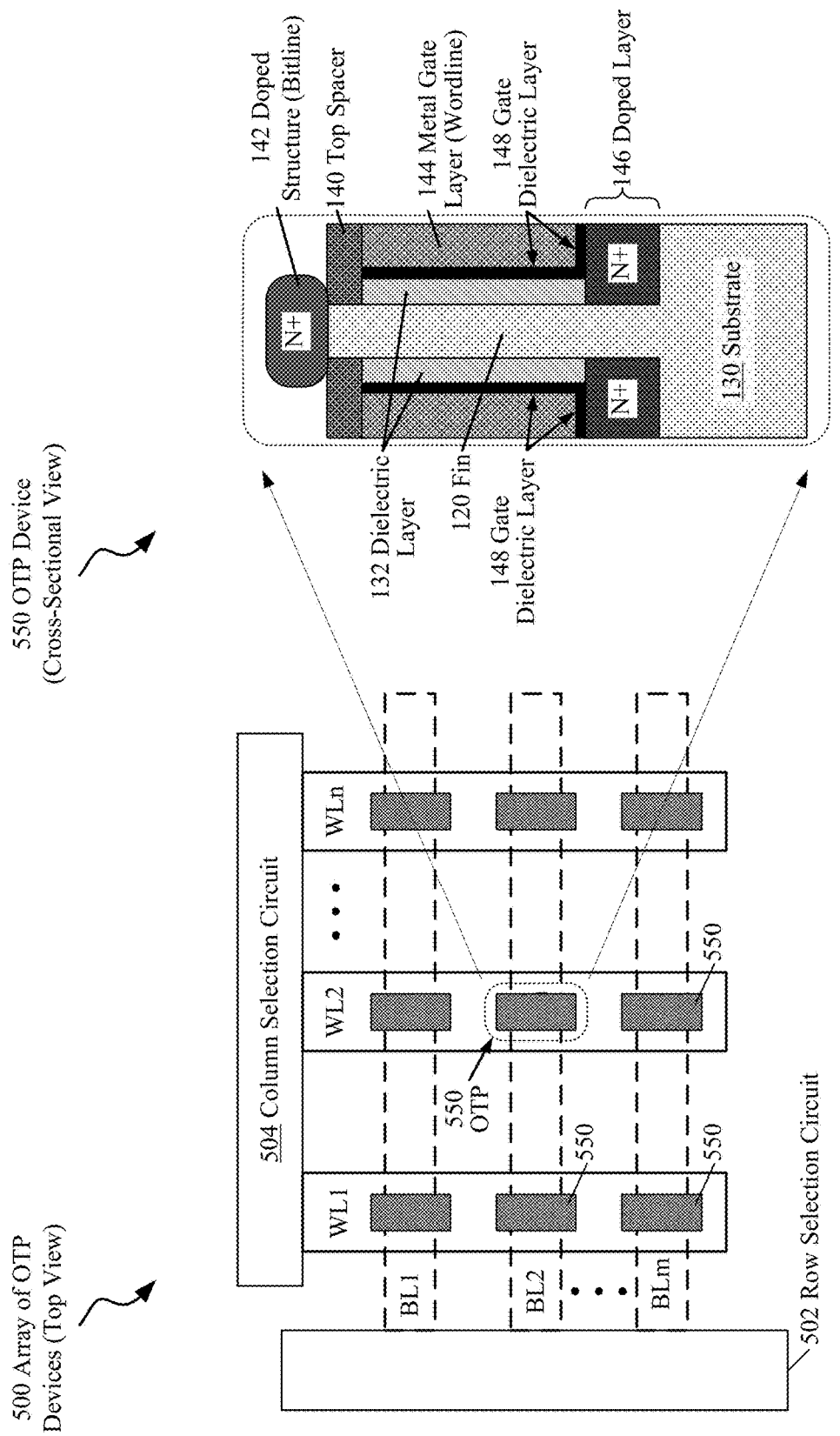
FIG. 5 includes a top view and a cross-sectional view depicting an array of OTP devices, according to embodiments consistent with the figures.

FIG. 5 includes a top view 500 depicting an array of OTP devices 550, according to embodiments consistent with the figures. According to embodiments, OTP devices 550 are consistent with OTP VFET 100. View 500 depicts an example array structure that can provide a wide variety of OTP device arrangements useful for storing various types and organizations of data within an IC.

Array 500 includes multiple OTP devices 550 organized in an array of rows and columns. The bitline (source) terminals 142 of each of the OTP devices 550 within a row are electrically interconnected to a common bitline wire, e.g., BL1, that is also interconnected to row selection circuit 502. Similarly, the wordline (gate) terminals 144 of each of the OTP devices 550 within a column are electrically interconnected to a common wordline wire, e.g., WL1, that is also interconnected to column selection circuit 504. According to embodiments, the bitline wires and wordline wires are consistent with wires formed within a plane of an IC that are used to interconnect active electronic devices of the IC.

In embodiments, an array 500 may have any number of rows or columns of OTP devices 550 suitable to hold particular amounts/types of data on the IC. For example, in some embodiments, array 500 may contain a single row or column a relatively small number of OTP devices 550, e.g., 8, which may be useful to hold data such as a single character or binary number. In some embodiments, array 500 may contain a much greater number of rows and columns that include a very large number of OTP devices 550, able to contain thousands or millions of data bits. Such larger data storage capacity can be particularly useful to hold data such as sections of processor-executable instructions, e.g., microcode, firmware, and/or BIOS used by one or more processor core(s) fabricated on the same IC as the array 500.

According to embodiments, the wordlines, e.g., WL1, WL2 . . . WLn of the array 500 are each accessible through the column selection circuit 504, and the bitlines, e.g., BL1, BL2 . . . BLm of the array 500 are each accessible through the row selection circuit 502. According to embodiments, the row selection circuit 502 and the column selection circuit 504 can be configured to apply, during a programming operation, a specified programming voltage between the gate/metal layer 144 and the source (bitline) 142 of the OTP VFET, as discussed above in reference to FIG. 1-3. The row selection circuit 502 and the column selection circuit 504 can be also be configured to apply, during a read operation, a specified read voltage between the gate/metal layer 144 and the source (bitline) 142 of the OTP VFET, as discussed above in reference to FIG. 1-3. Row selection circuit 502 and column selection circuit 504 can be understood to be generally consistent with similar types of row and column selection circuits which may be used to access other types of semiconductor memory cells such as an array of DRAM cells fabricated on an IC. Consistent with the function of these types of row and column selection circuits, multiple OTP devices 550 can be simultaneously programmed and simultaneously read when organized in an array 500.

Array 500 can be useful by providing non-volatile, permanent data storage for data such as IC serial numbers, identification (ID) codes, or IC health/status information, within the IC that the data pertains to. Such information can include a table of status information for a number of processor(s) and/or memory device(s) fabricated on the IC, e.g., maximum operating frequencies, obtained from testing, of various processor core(s), indications of faulty sections of memory and/or processor cores, or other characteristics of processor cores, memory areas, or the entire IC. Such data can be used by a hardware device or software, such as a hypervisor, to manage an electronic system. Such a hardware device or software can be configured to both write and read IC status information onto the IC, and later read it back in order to configure the IC and/or electronic system containing the IC.

Figure 6:
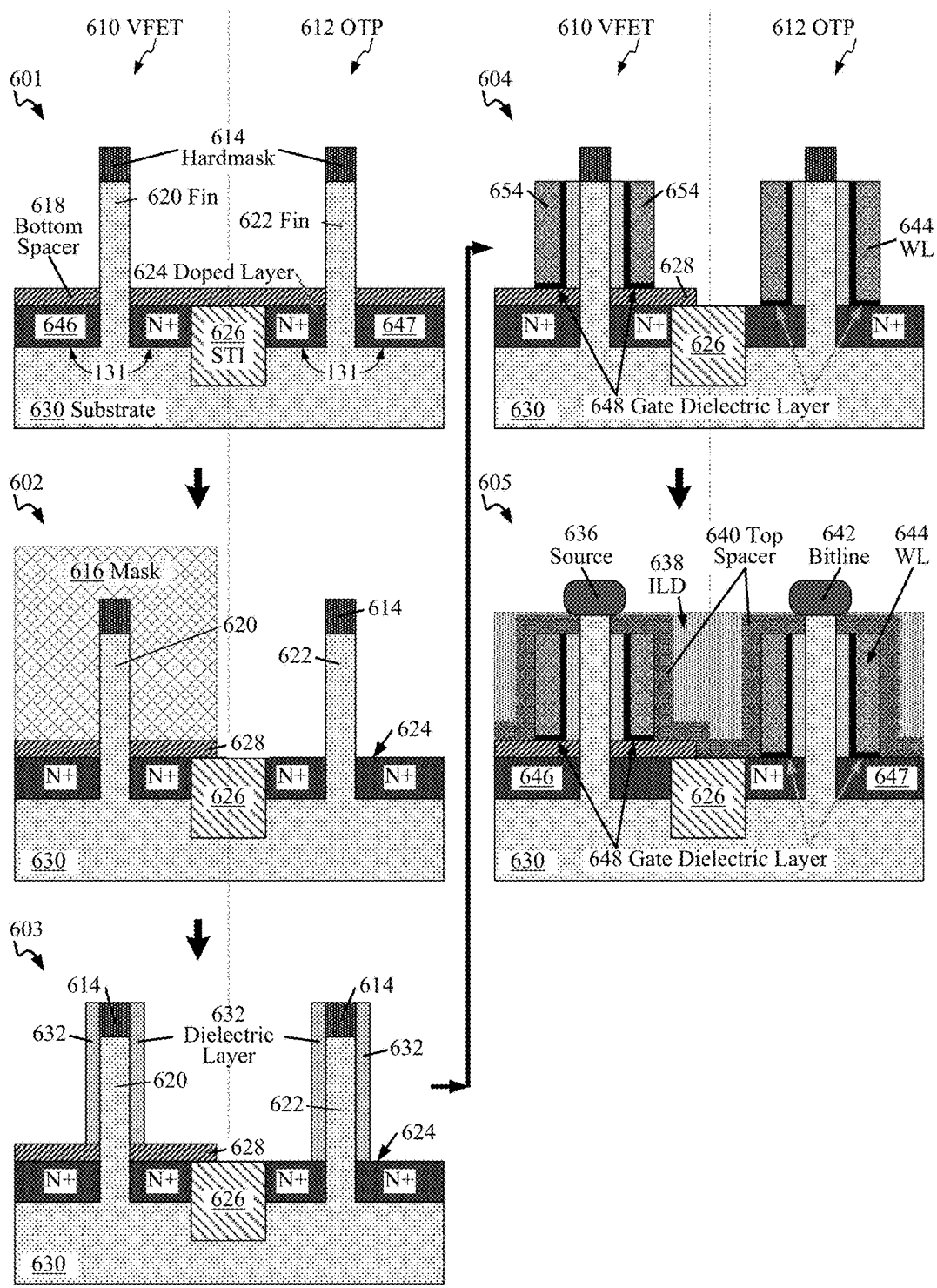
FIG. 6 includes a set of five consistent cross-sectional views illustrating the results of process operations for fabricating a VFET and an OTP VFET, according to embodiments consistent with the figures.

FIG. 6 includes a set of five consistent cross-sectional views 601-605 depicting the results of a set of process operations for simultaneously fabricating a VFET 610 and an OTP VFET 612 on an IC substrate 630, according to embodiments consistent with the figures. Embodiments of the present disclosure can be particularly useful in employing a consistent set of process operations to fabricate both a VFET 610 and an OTP VFET 612 on the same IC substrate 630, which can provide non-volatile, permanent data storage capability to ICs including VFETs. Such data storage capability can be provided, according to embodiments, without the need to employ a complex, potentially cost-prohibitive set of additional fabrication process operations and materials, which can be useful in managing and containing the design and production costs of ICs including both VFETs and OTPs. The views 601-605 illustrate an example process; other views and operations can be possible. An OTP VFET formed by process operations depicted in these views can be consistent with OTP VFETs depicted in FIGS. 1, 2, 4 and 5, and can be programmed to store a data value.

The progression depicted in views 601-605 begins with two vertical fins 620 and 622, a doped layer 624 and a bottom spacer 618 formed on the top surface of a substrate layer 630, as depicted in view 601. The progression ends with a completed VFET 610 and OTP VFET 612 formed on the substrate layer 630, as depicted in view 605. The results process operations depicted in views 601-605 are generally consistent with the method operations 704-714 depicted in FIG. 7.

The results of one or more process operations may be depicted in each view. For example, a view can depict the results of an etching process, which can also include photomask operations (apply, expose, develop, remove) that support the etching process. Processing operations associated with views 601-605 can include, but are not limited to etching, material layer deposition, layer planarization/polishing, photolithographic masking processes and insulator/oxide growth or deposition.

Completed structures may be generally shown in views 601-605 as having rectangular cross-sectional profiles, with surfaces orthogonal to each other. This depiction, however, is not limiting; structures can be of any suitable shape, size and profile, in accordance with specific design criteria, lithographic and manufacturing process limitations and tolerances for a given application. For example, corners shown as having right angles can be rounded, surfaces can have a non-orthogonal relative orientation, and relative dimensional ratios can vary from those depicted in the figures.

The relatively high permittivity values of various dielectric materials such as hafnium oxide or silicon nitride can make these materials useful in the fabrication of OTP devices. It can be understood that some level of material or chemical impurities may exist as a result of the use of a process designed to deposit or form a certain type of material, such as a gate dielectric layer. For example, in a process operation designed to deposit hafnium oxide, it can be appreciated that the material actually deposited may be substantially hafnium oxide, although some small amount of impurities can also be included, as an unintended result of the deposition process.

Prior to the operations performed corresponding to view 601, semiconductor fin structures, e.g., 620 and 622, can be formed from a semiconductor substrate 630 such as crystalline silicon. In some applications, the semiconductor substrate 630 can be doped, and in some applications, the semiconductor substrate 630 can remain undoped. A hardmask 614 and/or additional resist layer can be patterned onto a top surface of the semiconductor substrate 630 in order to define the location of fins to be created, e.g., 620 and 622. The fins can then be formed by etching the substrate with a highly anisotropic etch process, which is prevented from etching the substrate material masked by the hardmask/resist. The absence of a stop layer causes the etch process to be time-based, therefore the height of the resulting fin(s) is dependent upon the duration of a properly timed etch process. As depicted in FIG. 6, the fins 620 and 622 resulting from the etch process extend away from the top surface 131 of the IC substrate 630 in a direction normal to the top surface 131. Following the formation of the fins, hardmask 614 remains on a top surface of the fins 620 and 622.

The above-described process for creation of semiconductor fins, is not limiting; a number of alternative processes and process variations may be employed for fabrication of similar structures. According to embodiments, the operations described herein in reference to view 601 are performed following the above-described formation of fins 620, 622 and hardmask 614.

View 601 depicts the results of forming drains of the VFET 610 and the OTP VFET 612 by depositing a doped layer 624 onto the top surface 131 of the IC substrate 630. According to embodiments, a doped, e.g., epitaxial, layer 624, can be deposited onto the top surface 131 of the semiconductor substrate 630. Epitaxial materials can be grown from gaseous or liquid precursors, using vapor-phase epitaxy (VPE), molecular-beam epitaxy (MBE), liquid-phase epitaxy (LPE), RTCVD, metalorganic chemical vapor deposition (MOCVD), ultrahigh vacuum chemical vapor deposition (UHVCVD), low-pressure chemical vapor deposition (LPCVD), limited reaction processing CVD (LRP-CVD), or other suitable process. Epitaxial silicon, silicon germanium (SiGe), and/or carbon doped silicon (Si:C) silicon can be doped during deposition, i.e., in-situ doped, by adding dopants, n-type dopants, e.g., phosphorus or arsenic, or p-type dopants, e.g., boron or gallium, depending on the type of transistor. The dopant concentration in the source/drain can range from $1.0 \times 10^{18}$ cm$^{-3}$ to $2.0 \times 10^{21}$ cm$^{-3}$, or preferably between $2.0 \times 10^{20}$ cm$^{-3}$ to $1.0 \times 10^{21}$ cm$^{-3}$. The doped layer 624 can be doped to include a high dopant concentration, e.g., greater than $1.0 \times 10^{18}$ cm$^{-3}$, of either electrons or holes, making the doped layer either "N+" or "P+," respectively. Doped layer 624 can include materials such as epitaxial silicon, SiGe, and/or Si:C silicon. According to embodiments, drains 646 and 647 of VFET 610 and OTP 612, respectively, are formed by portions of the doped layer 624 in electrically conductive contact with fins 620 and 622, respectively.

Once the doped layer 624 has been formed, isolation such as a shallow trench isolation (STI) structure 626 can be created, in order to provide electrical isolation between adjacent fin-based devices VFET 610 and OTP 612. STI 626 can be formed by patterned etching of a trench in the substrate 630, depositing at least one dielectric material, e.g., silicon dioxide, to fill the trench, and by the subsequent removal of the excess dielectric using a technique such as planarization followed by recessing process.

Following the formation of STI structure 626, an electrically insulative bottom spacer layer 618 can be formed on the top surface of the doped layer 624. Bottom spacer layer 618 can include materials such as silicon nitride, silicon oxynitride, SiOC, SiBCN, SiOCN, SiCN, which can be deposited through processes such as ALD, MLD, CVD, or combination of those techniques.

Upon the completion of the above-described operations, both VFET 610 and OTP 612 have been subjected to the same set of process operations, which has resulted in VFET 610 and OTP 612 having similar structural features.

View 602 depicts the results of removing a portion of the bottom spacer layer 618 adjacent to fin 622 of OTP 612, while leaving a remaining bottom spacer 628 adjacent to fin 620 of VFET 610. According to embodiments, fin 620 and a surrounding portion of bottom spacer layer 618 may be covered by a patterned photomask 616. Following the masking of fin 620 an etching process such as dry etching, plasma etching, anisotropic etching or RIE may be used in order to selectively remove the portion of the bottom spacer layer 618 adjacent to the OTP 612. Once the portion of the bottom spacer layer 618 has been removed, the mask 616 is removed.

Remaining bottom spacer 628 can be subsequently useful for providing electrical isolation, between the gate dielectric layer 648 and the drain 646 in the VFET 610 while its absence in OTP 612 allows for the creation of a dielectric breakdown area, e.g., 152, FIG. 2, which can be used to provide permanent data storage capability to the OTP 612.

It can be noted that the removal of a portion of bottom spacer layer 618 is the only process operation depicted in FIG. 6 which is applied preferentially to either VFET 610 or OTP 612; the remainder of the depicted process operations are applied non-preferentially to the structures of both VFET 610 and OTP 612. This overall consistency in applied process operations can be useful in managing fabrication process cost, complexity and material sets, while fabricating both VFETs and OTPs on the same IC substrate.

View 603 depicts the results of depositing a dielectric layer 632 onto the side surfaces of the fins 620 and 622. In embodiments, the bottom edges of the dielectric layer 632 of OTP 612 are adjacent to, i.e., in contact with, portions of the top surface of the doped layer 624. Similarly, the bottom edges of the dielectric layer 632 of VFET 610 are adjacent to, i.e., in contact with, portions of the top surface of the bottom spacer 628.

In embodiments, dielectric layer 632 can include materials such as silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric may further include dopants such as lanthanum, aluminum, magnesium, which can be deposited through a deposition process such as thermal oxidation, chemical oxidation, thermal nitridation, atomic layer deposition (ALD), molecular layer deposition (MLD), CVD, LPCVD, PECVD, sub-atmospheric chemical vapor deposition (SACVD), RTCVD, in-situ radical assisted deposition, high temperature oxide deposition (HTO), low temperature oxide deposition (LTO), ozone/TEOS deposition, LRPCVD, ion beam deposition, electron beam deposition, laser assisted deposition, chemical solution deposition, or any combination of those methods. In some embodiments, the deposition of the dielectric layer 632 is followed by a directional etching process such as RIE.

In some embodiments, dielectric layer 632 can have a thickness greater than gate dielectric layer 648. Dielectric layer 632 can be used to increase the overall breakdown voltage of the gate dielectric layer 648. Dielectric layer 632 can also be useful for preventing dielectric breakdown from occurring, during a programming operation, along the side surfaces of fins 620 and 622. Dielectric layer 632 can provide an additional electrically insulative layer between a subsequently deposited gate metal layer and a respective fin, i.e., 620 or 622.

View 604 depicts the results of forming a gate dielectric layer and forming gates on both the VFET 610 and the OTP 612. In embodiments, a gate dielectric layer 648 is formed by depositing gate dielectric material onto exposed vertical side surfaces of the dielectric layer 632, onto horizontal exposed portions of the top surface of the doped layer 624 and remaining bottom spacer 628. Metal gates 654 of VFET 610 and 644 of OTP 612 are formed by depositing a metal layer onto exposed vertical and horizontal surfaces of the gate dielectric layer 648. The deposition processes for both the gate dielectric layer 648 and the metal layer may include one or more patterning/masking operations, in order to constrain the deposition area for both layers.

According to embodiments, the gate dielectric layer can include materials including, but not limited to, hafnium oxide, aluminum oxide, hafnium dioxide, silicon nitride and silicon dioxide. Gate dielectric material may be deposited through the use of various methods. A non-limiting list of such methods includes ALD, MLD, CVD, LPCVD, PECVD, RTCVD, in-situ radical assisted deposition, LRPCVD, MOCVD, physical vapor deposition, ion beam deposition, electron beam deposition, laser assisted deposition, chemical solution deposition, or any combination of those methods. In embodiments, the gate dielectric layer 648 can have a thickness ranging between 1.5 nm and 3.0 nm. Some embodiments can include gate dielectric layer materials having dielectric constants in a range between 7 and 28. According to embodiments, the metal gates can include materials including, but not limited to, a metal, e.g., tungsten, titanium, tantalum, ruthenium, zirconium, cobalt, copper, aluminum, lead, platinum, tin, silver, gold. The metal gates can also include conducting metallic compound materials including, but not limited to, tantalum nitride, titanium nitride, tantalum carbide, titanium carbide, titanium aluminum carbide, tungsten silicide, tungsten nitride, ruthenium oxide, cobalt silicide, nickel silicide, carbon nanotubes, conductive carbon, graphene, or any suitable combination of these materials. The conductive material may further include dopants that are incorporated during or after material deposition. In some embodiments, the metal gate may further include a work function metal layer. The work function layer may be a nitride, including, but not limited to, titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN) and niobium nitride (NbN). The work function layer may also be a carbide, including, but not limited to, titanium carbide (TiC) titanium aluminum carbide (TiAlC), tantalum carbide (TaC), hafnium carbide (HfC), and combinations thereof. In some embodiments, the metal gate can include workfunction metal only. In some embodiments, the metal gate can include multiple layers of materials. A metal layer can be deposited through the use of processes such as ALD, MLD, CVD, PVD, sputtering, plating, evaporation, ion beam deposition, electron beam deposition, laser assisted deposition, chemical solution deposition, or any combination of those methods.

View 605 depicts the results of forming an electrically insulative top spacer layer 640 and creating source terminals for both the VFET 610 and the OTP 612. In embodiments, an electrically insulative top spacer layer 640 is deposited onto the top edges of the dielectric layer 632, of the gate dielectric layer 648, and of the metal gates 654 and 644, and exposed horizontal and vertical surfaces of remaining bottom spacer 628, metal gates 654 and 644, doped layer 624 and STI 626. According to embodiments, the top spacer layer 640 can be formed from materials including, but not limited to silicon nitride, silicon oxynitride, SiOC, SiBCN, SiOCN, SiCN. Top spacer layer 640 can be deposited using a deposition process such as ALD, MLD, CVD, or combination of those techniques.

In embodiment, following the formation of top spacer layer 640, an inter-layer dielectric (ILD) 638 such as silicon oxide, flowable oxide, silicon oxynitride, SiOC, SiBCN, SiOCN and SiCN may be deposited over exposed surfaces of the top spacer layer 640. An ILD 638 can be deposited through the use of processes such as ALD, MLD, CVD, high density plasma chemical vapor deposition (HDPCVD), SACVD, RTCVD, in-situ radical assisted deposition, LTO, ozone/TEOS deposition, LRPCVD, PVD, sputtering, plating, evaporation, spin-on-coating, ion beam deposition, electron beam deposition, laser assisted deposition, chemical solution deposition, or any combination of those methods. Such an ILD 638 can be useful as an insulative material to fill gaps between vertical fins and other vertical structures and layers of an IC. In some embodiments, following the deposition of an ILD, an anneal process can be performed to improve the quality of the ILD material. In some embodiments following the formation of an ILD, the IC may be planarized or leveled through a process such as chemical-mechanical polishing (CMP). Such a process can be useful in removing excess ILD material and hardmasks 614. In some embodiments the IC is planarized to cause the top surface of top spacer layer 640 to be co-planar with the top surface of the fins 620 and 622. In some embodiments, the top surface of top spacer layer 640 can be above or below the top surface of the fin 620 and 622.

According to embodiments, once the IC top surface has been planarized, source terminals for both the VFET 610 and the OTP 612 are created by forming doped structures 636 and 642 onto and in electrically conductive contact with the top surface of the fins 620 and 622, respectively. The materials and processes used for this deposition operation may be consistent with those used for the formation of doped layer 624, and may include one or more masking/patterning operations to limit the dimensions of the doped structures. Doped structure 636 serves as a source terminal for VFET 610, and doped structure 642 serves as a source/bitline terminal for OTP 612.

The process operations detailed above are discussed and depicted for the formation of one VFET 610 and one OTP 612. However, in the practice of the disclosure, multiple VFETs and multiple OTPs can be fabricated on a single IC. The above-described process for creation of semiconductor fins, doped layer and structures is not limiting; a number of alternative processes and process variations may be employed for fabrication of similar structures.

Figure 7:
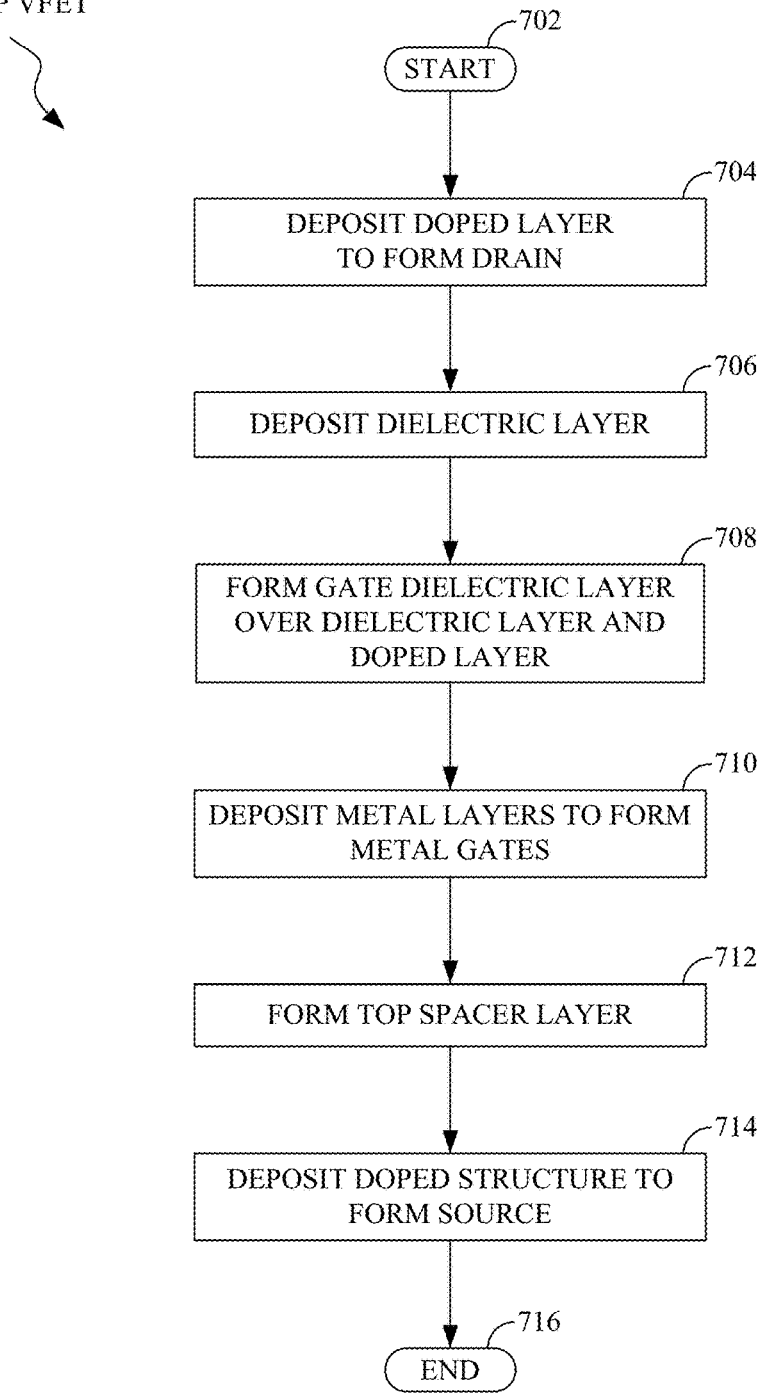
FIG. 7 is a flow diagram illustrating a method for fabricating a one-time programmable OTP VFET, according to embodiments consistent with the figures.

FIG. 7 is a flow diagram illustrating operations of a method 700 for fabricating, on an IC substrate, a VFET and an OTP VFET, according to embodiments consistent with the figures. Method 700 can be useful for enhancing the capability of an IC by adding data storage capability within an OTP VFET. The operations described herein in reference to the method 700 generally correspond to FIGS. 1-6, and their associated descriptions, and in particular to the results of process operations depicted in cross-sectional views 601-605, FIG. 6, and their associated descriptions. The method 700 for fabricating an OTP VFET can be useful for creating an OTP device that can provide permanent, non-volatile data storage, and that is compatible with existing IC material sets and fabrication technologies.

The method 700 moves from start 702 to operation 704. Operation 704 generally refers to the operation(s) that involve forming a drain of the OTP VFET by depositing a doped layer onto a top surface of an IC substrate, which may correspond to the view 601, FIG. 6, and its associated description. According to embodiments, portions of the doped layer are deposited adjacent to and in electrically conductive contact with a portion of the OTP VFET fin, which can allow current to flow between a channel formed within the fin and the drain structure. Once the doped layer has been deposited, and STI structure can be formed between adjacent devices, e.g., between a VFET and an OTP VFET, to prevent current leakage between the devices. A bottom spacer can subsequently be deposited onto the doped layer and STI in order to provide electrical isolation between a VFET drain and a subsequently formed gate dielectric layer. A portion of the bottom spacer can be removed in order to create a dielectric breakdown area within the OTP VFET structure. Once the drain of the OTP VFET has been formed, the process moves to operation 706.

Operation 706 generally refers to operation(s) that involve depositing a dielectric layer onto side surfaces of the fins, which may correspond to the view 603, FIG. 6, and its associated description. According to embodiments, a deposited dielectric layer generally has a thickness greater than a gate dielectric layer thickness, and can be useful for preventing dielectric breakdown from occurring, during a programming operation, along the side surfaces of the OTP VFET fins. A dielectric layer can be useful as an electrically insulative layer between a subsequently deposited gate metal layer and a respective VFET or OTP VFET fin. According to embodiments, the bottom edges of the deposited layer of an OTP are adjacent to, i.e., in contact with, portions of the top surface of the previously deposited doped layer. According to process operations used in IC fabrication, photolithographic techniques involving the use of photomasks and photoresist can be employed in operation 706 in order to restrict an area for the deposition of the dielectric layer. Once the dielectric layer has been deposited onto the side surfaces of the fins, the process moves to operation 708.

Operation 708 generally refers to the operation(s) that involve forming a gate dielectric layer by depositing dielectric layer material onto the dielectric layer and onto the top surface of the doped layer, which may correspond to the view 604, FIG. 6, and its associated description. In embodiments, a gate dielectric layer can be formed by depositing gate dielectric material onto exposed vertical side surfaces of the dielectric layer and onto horizontal exposed portions of the top surface of the doped layer and remaining bottom spacer. The gate dielectric layer can be useful as a data storage mechanism within a dielectric breakdown area of an OTP VFET. According to process operations used in IC fabrication, photolithographic techniques involving the use of photomasks and photoresist can be employed in operation 708 in order to restrict an area for the deposition of the gate dielectric layer. Once the gate dielectric layer has been formed, the process moves to operation 710.

Operation 710 generally refers to the operation(s) that involve forming a gate of the OTP VFET by depositing a metal layer onto the gate dielectric layer, which may correspond to the view 604, FIG. 6, and its associated description. In embodiments, a metal gate can be formed by depositing a metal layer onto exposed vertical and horizontal surfaces of the gate dielectric layer. A metal gate of a VFET can be useful in controlling or modulating current flow between source and drain terminals of the VFET. According to process operations used in IC fabrication, photolithographic techniques involving the use of photomasks and photoresist can be employed in operation 710 in order to restrict an area for the deposition of the gate dielectric layer. Once the gate of the OTP VFET has been formed, the process moves to operation 712.

Operation 712 generally refers to the operation(s) that involve forming a top spacer layer of the OTP VFET, which may correspond to the view 605, FIG. 6, and its associated description. In embodiments, an electrically insulative top spacer layer can be deposited onto the top edges of the dielectric layer, of the gate dielectric layer, and of the metal gates. The top spacer layer can also be formed on exposed horizontal and vertical surfaces of a remaining bottom spacer, metal gates, the doped layer and STI. A top spacer layer can be useful in insulating the gate dielectric layer and metal gate from conductive structures, e.g., a doped structure such as a VFET source terminal or OTP VFET bitline, subsequently formed above the gate dielectric and metal gate layers. The top spacer layer can also serve as a relatively planar surface upon which to form one or more doped structures. Once the top spacer layer of the OTP VFET has been formed, the process moves to operation 714.

Operation 714 generally refers to the operation(s) that involve creating a source terminal of the OTP VFET by forming a doped structure onto the top surface of the OTP VFET fin, which may correspond to the view 605, FIG. 6, and its associated description. According to embodiments, source terminals for both the VFET 610 and the OTP 612 can be created on a planarized IC top surface, such as the top spacer layer. The doped structures that form the source terminals are created to be in electrically conductive contact with the top surface of the fins the VFET and the OTP VFET. According to process operations used in IC fabrication, photolithographic techniques involving the use of photomasks and photoresist can be employed in operation 714 in order to restrict an area for the deposition of the doped structure. Once the source of the OTP VFET is created, the process 700 may end at block 716.

Figure 8:
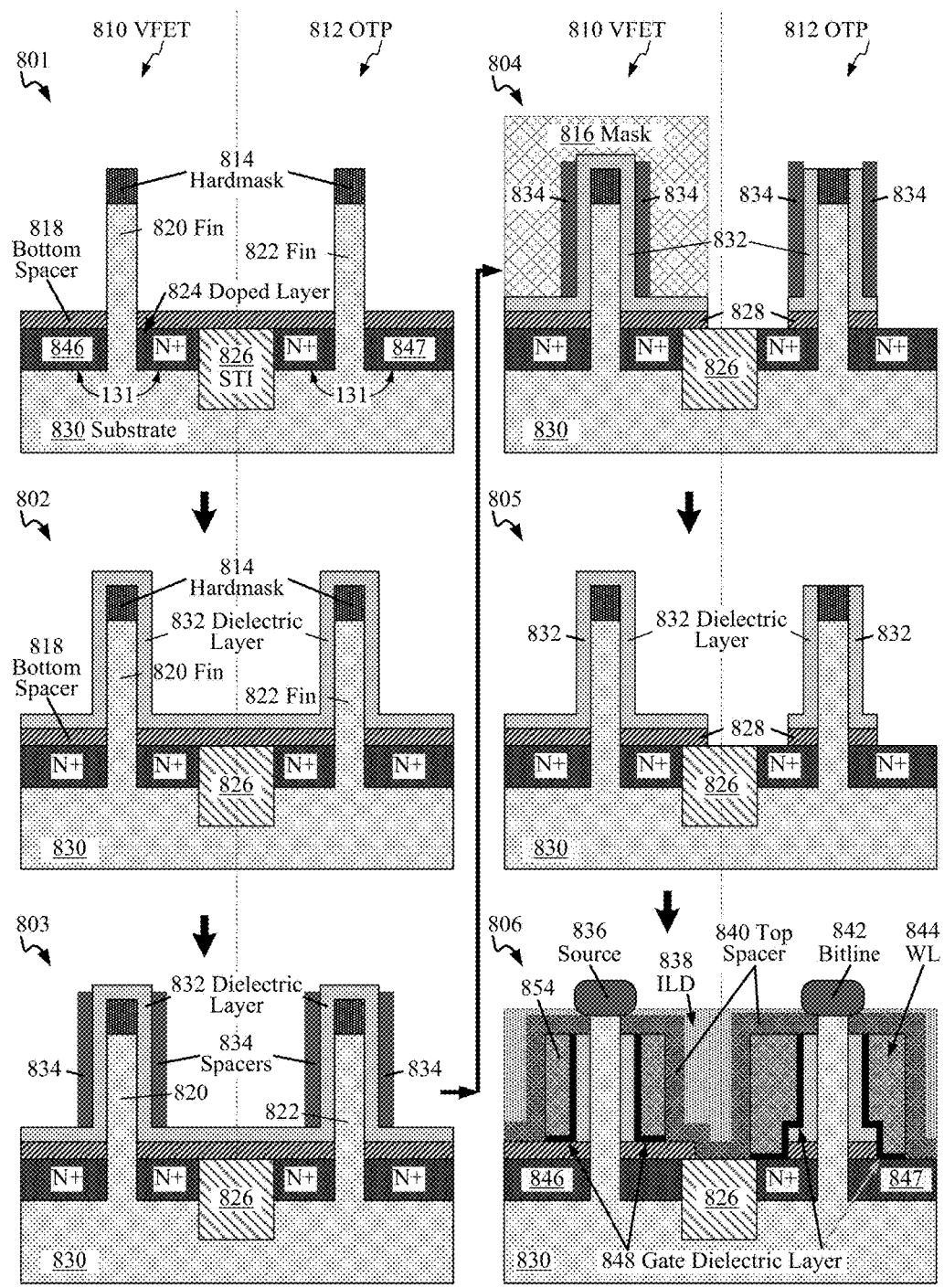
FIG. 8 includes a set of six consistent cross-sectional views illustrating the results of process operations for fabricating a VFET and an OTP VFET, according to embodiments consistent with the figures.

FIG. 8 includes a set of six consistent cross-sectional views 801-806 depicting the results of a set of process operations for simultaneously fabricating a VFET 810 and an OTP VFET 812 on an IC substrate 830, according to embodiments consistent with the figures. Embodiments of the present disclosure can be particularly useful in employing a consistent set of process operations to fabricate both a VFET 810 and an OTP VFET 812 on the same IC substrate 830, which can provide non-volatile, permanent data storage capability to ICs including VFETs. Such data storage capability can be provided, according to embodiments, without the need to employ a complex, potentially cost-prohibitive set of additional fabrication process operations and materials, which can be useful in managing and containing the design and production costs of ICs including both VFETs and OTPs.

The set of process operations depicted in views 801-806 of FIG. 8 includes certain variations from the set of process operations depicted in FIG. 6, however both sets of process operations result in the fabrication of an OTP VFET having a consistent dielectric breakdown area, e.g., 152, FIG. 2, which can be useful for storing data within the OTP VFET. The sets of process operations depicted in FIG. 6 and FIG. 8 serve as non-limiting examples; it can be understood that, within the spirit and scope of the present disclosure, many such process operations set variations may exist which can be used to produce similar dielectric breakdown areas within an OTP VFET. An OTP VFET formed by process operations depicted in these views can be consistent with OTP VFETs depicted in FIGS. 1, 2, 4 and 5, and can be programmed to store a data value.

The progression depicted in views 801-806 begins with two vertical fins 820 and 822, a doped layer 824 and a bottom spacer 818 formed on the top surface of a substrate layer 830, as depicted in view 801. The progression ends with a completed VFET 810 and OTP VFET 812 formed on the substrate layer 830, as depicted in view 806. The results process operations depicted in views 801-806 are generally consistent with the method operations 904-918 depicted in FIG. 9.

The results of one or more process operations may be depicted in each view. For example, a view can depict the results of an etching process, which can also include photomask operations (apply, expose, develop, remove) that support the etching process. Processing operations associated with views 801-806 can include, but are not limited to etching, material layer deposition, layer planarization/polishing, photolithographic masking processes and insulator/oxide growth or deposition.

Completed structures may be generally shown in views 801-806 as having rectangular cross-sectional profiles, with surfaces orthogonal to each other. This depiction, however, is not limiting; structures can be of any suitable shape, size and profile, in accordance with specific design criteria, lithographic and manufacturing process limitations and tolerances for a given application. For example, corners shown as having right angles can be rounded, surfaces can have a non-orthogonal relative orientation, and relative dimensional ratios can vary from those depicted in the figures.

The relatively high permittivity values of various dielectric materials such as hafnium oxide or silicon nitride can make these materials useful in the fabrication of OTP devices. It can be understood that some level of material or chemical impurities may exist as a result of the use of a process designed to deposit or form a certain type of material, such as a gate dielectric layer. For example, in a process operation designed to deposit hafnium oxide, it can be appreciated that the material actually deposited may be substantially hafnium oxide, although some small amount of impurities can also be included, as an unintended result of the deposition process.

Prior to the operations performed corresponding to view 801, semiconductor fin structures, e.g., 820 and 822 and hardmask 814 can be formed from a semiconductor substrate 830, as described in reference to FIG. 6. According to embodiments, the operations described herein in reference to view 801 are performed following the formation of fins 820, 822 and hardmask 814.

View 801 depicts the results of forming drains of the VFET 810 and the OTP VFET 812 by depositing a doped layer 824 onto the top surface 131 of the IC substrate 830.

According to embodiments, a doped, e.g., epitaxial, layer 824 can be deposited onto the top surface 131 of the semiconductor substrate 830. Epitaxial materials can be grown from gaseous or liquid precursors, using VPE, MBE, LPE, RTCVD, MOCVD, UHVCVD, LPCVD, LRPCVD, or other suitable process. Epitaxial silicon, SiGe, and/or Si:C silicon can be doped during deposition, i.e., in-situ doped, by adding dopants, n-type dopants, e.g., phosphorus or arsenic, or p-type dopants, e.g., boron or gallium, depending on the type of transistor. The dopant concentration in the source/drain can range from $1.0 \times 10^{18}$ cm$^{-3}$ to $2.0 \times 10^{21}$ cm$^{-3}$, or preferably between $2.0 \times 10^{20}$ cm$^{-3}$ to $1.0 \times 10^{21}$ cm$^{-3}$. The doped layer 824 can be doped to include a high dopant concentration, e.g., greater than $1.0 \times 10^{18}$ cm$^{-3}$, of either electrons or holes, making the doped layer either "N+" or "P+," respectively. Doped layer 824 can include materials such as epitaxial silicon, SiGe, and/or Si:C silicon. According to embodiments, drains 846 and 847 of VFET 810 and OTP 812, respectively, are formed by portions of the doped layer 824 in electrically conductive contact with fins 820 and 822, respectively.

Once the doped layer 824 has been formed, isolation such as an STI structure 826 can be created, in order to provide electrical isolation between adjacent fin-based devices VFET 810 and OTP 812. STI 826 can be formed by patterned etching of a trench in the substrate 830, deposition of at least one dielectric material, e.g., silicon dioxide, to fill the trench, and by subsequent removal of the excess dielectric using a technique such as planarization followed by recessing process.

Following the formation of STI structure 826, an electrically insulative bottom spacer layer 818 can be formed on the top surface of the doped layer 824. Bottom spacer layer 818 can include materials such as silicon nitride, silicon oxynitride, SiOC, SiBCN, SiOCN, SiCN, which can be deposited through processes such as ALD, MLD, CVD, or combination of those techniques. View 802 depicts the results of depositing a dielectric layer 832 onto the side and top surfaces of the fins 820 and 822 of OTP 812 and VFET 810, and onto the top surface of the bottom spacer layer 818.

In embodiments, dielectric layer 832 can include materials such as silicon oxide, silicon oxynitride, silicon nitride, or high-k dielectric and can be deposited through a deposition process such as thermal oxidation, chemical oxidation, thermal nitridation, ALD, MLD, CVD, LPCVD, PECVD, SACVD, RTCVD, in-situ radical assisted deposition, HTO, LTO, ozone/TEOS deposition, LRPCVD, ion beam deposition, electron beam deposition, laser assisted deposition, chemical solution deposition, or any combination of those methods. In some embodiments, the deposition of the dielectric layer 832 is followed by a directional etching process such as RIE.

In some embodiments, dielectric layer 832 can have a thickness greater than gate dielectric layer 848. Dielectric layer 832 can be used to increase the overall breakdown voltage of the gate dielectric layer 848. Dielectric layer 832 can also be useful for preventing dielectric breakdown from occurring, during a programming operation, along the side surfaces of fins 820 and 822. Dielectric layer 832 provides an electrically insulative layer between a subsequently deposited gate metal layer and a respective fin, i.e., 820 or 822.

View 803 depicts the results forming sacrificial spacers 834 by depositing sacrificial spacer material onto side surfaces of the dielectric layer 832 of OTP 812 and VFET 810. In embodiments, bottom edges of the sacrificial spacers 834 are vertically adjacent, i.e., in contact with, portions of a top surface of the dielectric layer 832.

In embodiments, sacrificial spacers 834 can include materials such as amorphous carbon, amorphous silicon, polycrystalline silicon and titanium nitride and can be deposited through a deposition process such as CVD, ALD, PECVD, etc. In embodiments, sacrificial spacers 834 can be useful in defining a subsequent etch mask/profile.

Upon the completion of the above-described operations, both VFET 810 and OTP 812 have been subjected to the same set of process operations, which has resulted in VFET 810 and OTP 812 having consistent structural features.

View 804 depicts the results of removing portions of the bottom spacer layer 818 and dielectric layer 832 between fins 820 and 822, while leaving remaining portions 828 of bottom spacer 828 and remaining portions of dielectric layer 832 adjacent to fins 820 and 822.

According to embodiments, fin 820 and a surrounding portion of dielectric layer 832 may be covered by a patterned mask 816. Following the masking of fin 820 an etching process such as dry etching, plasma etching, anisotropic etching or RIE may be used in order to selectively remove the portions of the bottom spacer layer 818 and dielectric layer 832 between fins 820 and 822, i.e., portions that are outside of an area defined on the of dielectric layer 832 by a combined footprint of the sacrificial spacers, the vertical portions of the dielectric layer 832 and the mask 816.

Once the portions of the bottom spacer layer 818 and dielectric layer 832 have been removed, the mask 816 is removed. An "L-shaped" dielectric layer 832 and a portion of bottom spacer layer 818 underneath the dielectric layer 832 remain, where these layers were not shielded from the etch by either the mask 816 or sacrificial spacers 834. Remaining bottom spacer 828 can be subsequently useful for providing electrical isolation, between the gate dielectric layer 848 and the drain 846 in the VFET 810.

It can be noted that the removal of a portions of the bottom spacer layer 818 and dielectric layer 832 is the only process operation depicted in FIG. 8 which is applied preferentially to either VFET 810 or OTP 812; the remainder of the depicted process operations are applied non-preferentially to the structures of both VFET 810 and OTP 812. This overall consistency in applied process operations can be useful in managing fabrication process cost, complexity and material sets, while fabricating both VFETs and OTPs on the same IC substrate.

View 805 depicts the results of removing sacrificial spacers 834 from the side surfaces of the dielectric layer 832 of both VFET 810 and OTP 812. An etching process such as dry etching, plasma etching, ashing, wet etching, or any suitable combination of those techniques may be used in order to selectively remove sacrificial spacers 834.

View 806 depicts the results of forming a gate dielectric layer and forming gates on both the VFET 810 and the OTP 812. In embodiments, a gate dielectric layer 848 is formed by depositing gate dielectric material onto exposed vertical side surfaces of the dielectric layer 832, onto horizontal exposed portions of the top surface of the doped layer 824 and onto remaining bottom spacer 828. Metal gates 854 of VFET 810 and 844 of OTP 812 are formed by depositing a metal layer onto exposed vertical and horizontal surfaces of the gate dielectric layer 848. The deposition processes for both the gate dielectric layer 848 and the metal layer may include one or more patterning/masking operations, in order to constrain the deposition area for both layers.

According to embodiments, the gate dielectric layer can include materials including, but not limited to, hafnium oxide, aluminum oxide, hafnium dioxide, silicon nitride and silicon dioxide. Such gate dielectric material may be deposited through the use of various methods. A non-limiting list of such methods includes ALD, MLD, CVD, LPCVD, PECVD, RTCVD, in-situ radical assisted deposition, LRP-CVD, MOCVD, physical vapor deposition, ion beam deposition, electron beam deposition, laser assisted deposition, chemical solution deposition, or any combination of those methods. In embodiments, the gate dielectric layer 848 can have a thickness ranging between 1.5 nm and 3.0 nm. Some embodiments can include gate dielectric layer materials having dielectric constants in a range between 7 and 28. According to embodiments, the metal gates can include materials, but not limited to, a metal, e.g., tungsten, titanium, tantalum, ruthenium, zirconium, cobalt, copper, aluminum, lead, platinum, tin, silver, gold. The metal gates can also include conducting metallic compound materials including, but not limited to, tantalum nitride, titanium nitride, tantalum carbide, titanium carbide, titanium aluminum carbide, tungsten silicide, tungsten nitride, ruthenium oxide, cobalt silicide, nickel silicide, carbon nanotubes, conductive carbon, graphene, or any suitable combination of these materials. The conductive material may further include dopants that are incorporated during or after material deposition. In some embodiments, the metal gate may further include a work function metal layer. The work function layer may be a nitride, including, but not limited to, TiN, HfN, HfSiN, TaN, TaSiN, WN, MoN and NbN. The work function layer may also be a carbide, including, but not limited to, TiC, TiAlC, TaC, HfC, and combinations thereof. In some embodiments, the metal gate can include workfunction metal only. In some embodiments, the metal gate can include multiple layers of materials. A metal layer can be deposited through the use of processes such as ALD, MLD, CVD, PVD, sputtering, plating, evaporation, ion beam deposition, electron beam deposition, laser assisted deposition, chemical solution deposition, or any combination of those methods.

View 806 also depicts the results of forming an electrically insulative top spacer layer 840 and creating source terminals for both the VFET 810 and the OTP 812. In embodiments, an electrically insulative top spacer layer 840 is deposited onto the top edges of the dielectric layer 832, of the gate dielectric layer 848, and of the metal gates 854 and 844, and exposed horizontal and vertical surfaces of remaining bottom spacer 828, metal gates 854 and 844, doped layer 824 and STI 826. According to embodiments, the top spacer layer 840 can be formed from materials including, but not limited to silicon nitride, silicon oxynitride, SiOC, SiBCN, SiOCN, SiCN. Top spacer layer 640 can be deposited using a deposition process such as ALD, MLD, CVD, or combination of those techniques.

In embodiment, following the formation of top spacer layer 840, ILD 638 such as silicon oxide, flowable oxide, silicon oxynitride, SiOC, SiBCN, SiOCN and SiCN may be deposited over exposed surfaces of the top spacer layer 640. An ILD 638 can be deposited through the use of processes such as ALD, MLD, CVD, HDPCVD, SACVD, RTCVD, in-situ radical assisted deposition, LTO, ozone/TEOS deposition, LRPCVD, PVD, sputtering, plating, evaporation, spin-on-coating, ion beam deposition, electron beam deposition, laser assisted deposition, chemical solution deposition, or any combination of those methods. Such an ILD 838 can be useful as an insulative and structural material to fill gaps between vertical fins and other vertical structures and layers of an IC. In some embodiments, following the deposition of an ILD, an anneal process can be performed to improve the quality of the ILD material. In some embodiments following the formation of an ILD, the IC may be planarized or leveled through a process such as CMP. Such a process can be useful in removing excess ILD material and hardmasks 814. In some embodiments the IC is planarized to cause the top surface of top spacer layer 840 to be co-planar with the top surface of the fins 820 and 822. In some embodiments, the top surface of top spacer layer 840 can be above or below the top surface of the fin 820 and 822.

According to embodiments, once the IC top surface has been planarized, source terminals for both the VFET 810 and the OTP 812 are created by forming doped structures 836 and 842 onto and in electrically conductive contact with the top surface of the fins 820 and 822, respectively. The materials and processes used for this deposition operation may be consistent with those used for the formation of doped layer 824, and may include one or more masking/patterning operations to limit the dimensions of the doped structures. Doped structure 836 serves as a source terminal for VFET 810, and doped structure 842 serves as a source/bitline terminal for OTP 812.

The process operations detailed above are discussed and depicted for the formation of one VFET 810 and one OTP 812. However, in the practice of the disclosure, multiple VFETs and multiple OTPs can be fabricated on a single IC. The above-described process for creation of semiconductor fins, doped layer and structures is not limiting; a number of alternative processes and process variations may be employed for fabrication of similar structures.

Figure 9:
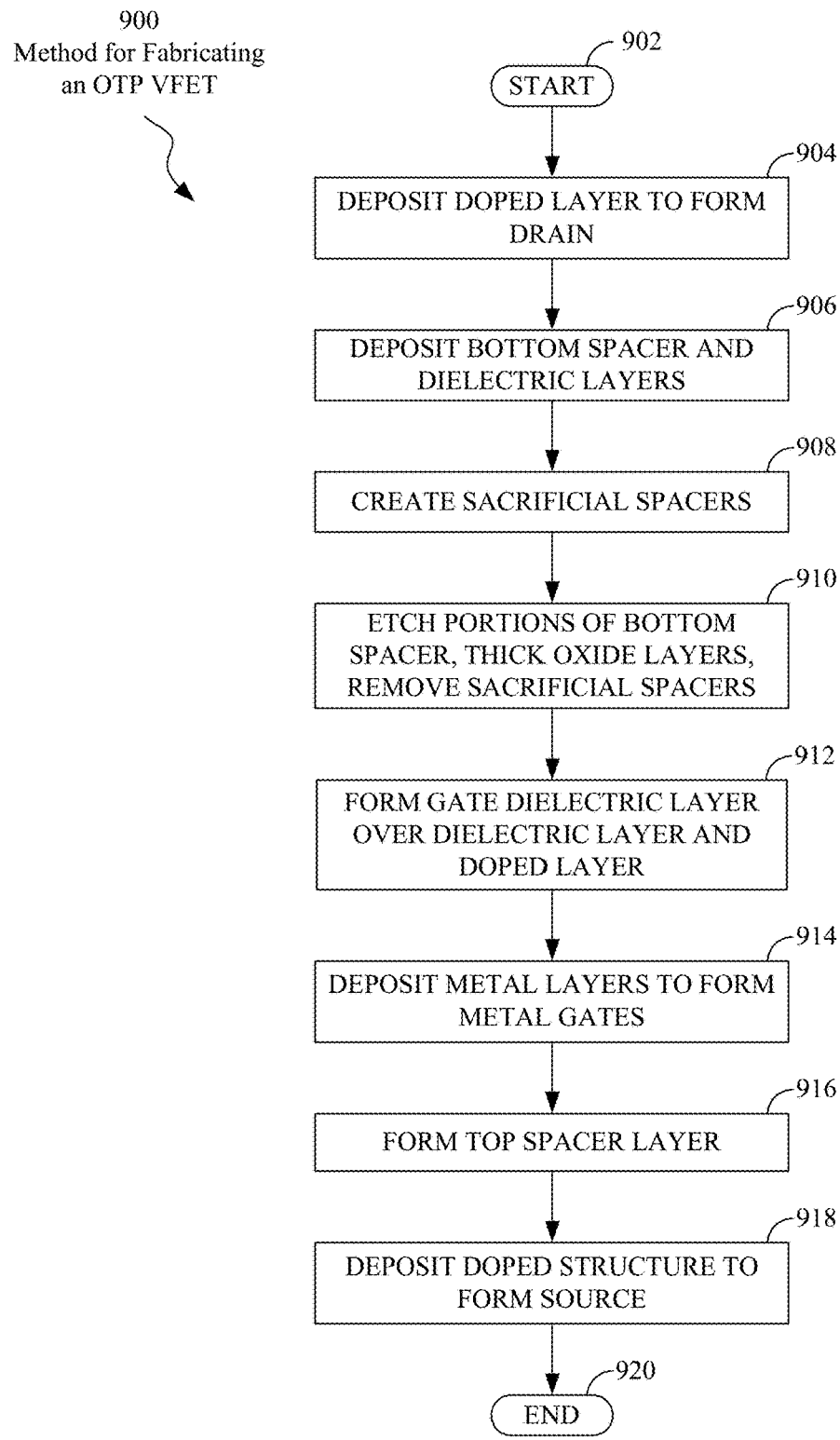
FIG. 9 is a flow diagram illustrating a method for fabricating an OTP VFET, according to embodiments consistent with the figures.

FIG. 9 is a flow diagram illustrating operations of a method 900 for fabricating, on an IC substrate, a VFET and an OTP VFET, according to embodiments consistent with the figures. Method 900 can be useful for enhancing the capability of an IC by adding data storage capability within an OTP VFET. The operations described herein in reference to the method 900 generally correspond to FIGS. 1-8, and their associated descriptions, and in particular to the results of process operations depicted in cross-sectional views 801-806, FIG. 8, and their associated descriptions. The method 900 for fabricating an OTP VFET can be useful for creating an OTP device that can provide permanent, non-volatile data storage, and that is compatible with existing IC material sets and fabrication technologies.

The method 900 moves from start 902 to operation 904. Operation 904 generally refers to the operation(s) that involve forming a drain of the OTP VFET by depositing a doped layer onto a top surface of an IC substrate, which may correspond to the view 801, FIG. 8, and its associated description. According to embodiments, portions of the doped layer are deposited adjacent to and in electrically conductive contact with a portion of the OTP VFET fin, which can allow current to flow between a channel formed within the fin and the drain structure. Once the doped layer has been deposited, and STI structure can be formed between adjacent devices, e.g., between a VFET and an OTP VFET, to prevent current leakage between the devices. Once the drain of the OTP VFET has been formed, the process moves to operation 906.

Operation 906 generally refers to operation(s) that involve depositing a bottom spacer onto the doped layer and depositing a dielectric layer onto side surfaces of the fins, which may correspond to the views 801 and 802, FIG. 8, and their associated descriptions. According to embodiments, a deposited dielectric layer generally has a thickness greater than a gate dielectric layer thickness, and can be useful for preventing dielectric breakdown from occurring, during a programming operation, along the side surfaces of the OTP VFET fins. A dielectric layer can be useful as an electrically insulative layer between a subsequently deposited gate metal layer and a respective VFET or OTP VFET fin. According to process operations used in IC fabrication, photolithographic techniques involving the use of photomasks and photoresist can be employed in operation 906 in order to restrict an area for the deposition of the dielectric layer.

Once the bottom spacer has been deposited onto the doped layer and the dielectric layer has been deposited onto the side surfaces of the fins, the process moves to operation 908.

Operation 908 generally refers to the operation(s) that involve creating sacrificial spacers by depositing sacrificial spacer material onto side surfaces of the dielectric layer, which may correspond to the view 803, FIG. 8, and its associated description. According to embodiments, the bottom edges of the sacrificial spacers can be vertically adjacent to, i.e., in contact with, portions of a top surface of the dielectric layer. Sacrificial spacers can be useful in serving as a mask in subsequent etching operations. Once the sacrificial spacers have been created, the process moves to operation 910.

Operation 910 generally refers to the operation(s) that involve removing portions of the dielectric layer and of the bottom spacer layer. These portions are outside of an area defined on the doped layer by a combined footprint of the sacrificial spacers, the vertical portions of the dielectric layer, and a mask patterned to protect fin 820 of VFET 810. Operation 910 may correspond to the view 805, FIG. 8, and its associated description. Following the etching of portions of the dielectric layer and of the bottom spacer layer, the sacrificial spacers are removed from the side surfaces of the dielectric layer. Once the layer portions have been etched, and the sacrificial spacers have been removed, the process moves to operation 912.

Operation 912 generally refers to the operation(s) that involve forming a gate dielectric layer by depositing dielectric layer material onto side surfaces of the dielectric layer and onto exposed surfaces of the of the bottom spacer and of the doped layer, which may correspond to the view 806, FIG. 8, and its associated description. The gate dielectric layer can be useful as a data storage mechanism within a dielectric breakdown area of an OTP VFET. According to process operations used in IC fabrication, photolithographic techniques involving the use of photomasks and photoresist can be employed in operation 908 in order to restrict an area for the deposition of the gate dielectric layer. Once the gate dielectric layer has been formed, the process moves to operation 914.

Operation 914 generally refers to the operation(s) that involve forming a gate of the OTP VFET by depositing a metal layer onto the gate dielectric layer, which may correspond to the view 806, FIG. 8, and its associated description. In embodiments, a metal gate can be formed by depositing a metal layer onto exposed vertical and horizontal surfaces of the gate dielectric layer. A metal gate of a VFET can be useful in controlling or modulating current flow between source and drain terminals of the VFET. According to process operations used in IC fabrication, photolithographic techniques involving the use of photomasks and photoresist can be employed in operation 910 in order to restrict an area for the deposition of the gate dielectric layer. Once the gate of the OTP VFET has been formed, the process moves to operation 916.

Operation 916 generally refers to the operation(s) that involve forming a top spacer layer of the OTP VFET, which may correspond to the view 806, FIG. 8, and its associated description. In embodiments, an electrically insulative top spacer layer can be deposited onto the top edges of the dielectric layer, of the gate dielectric layer, and of the metal gates. The top spacer layer can also be formed on exposed horizontal and vertical surfaces of a remaining bottom spacer, metal gates, the doped layer and STI. A top spacer layer can be useful in insulating the gate dielectric layer and metal gate from conductive structures, e.g., a doped structure such as a VFET source terminal or OTP VFET bitline, subsequently formed above the gate dielectric and metal gate layers. The top spacer layer can also serve as a relatively planar surface upon which to form one or more doped structures. Once the top spacer layer of the OTP VFET has been formed, the process moves to operation 918.

Operation 918 generally refers to the operation(s) that involve creating a source terminal of the OTP VFET by forming a doped structure onto the top surface of the OTP VFET fin, which may correspond to the view 806, FIG. 8, and its associated description. According to embodiments, source terminals for both the VFET 810 and the OTP 812 can be created on a planarized IC top surface, such as the top spacer layer. The doped structures that form the source terminals are created to be in electrically conductive contact with the top surface of the fins the VFET and the OTP VFET. According to process operations used in IC fabrication, photolithographic techniques involving the use of photomasks and photoresist can be employed in operation 914 in order to restrict an area for the deposition of the doped structure. Once the source of the OTP VFET is created, the process 900 may end at block 920.

Figure 10:
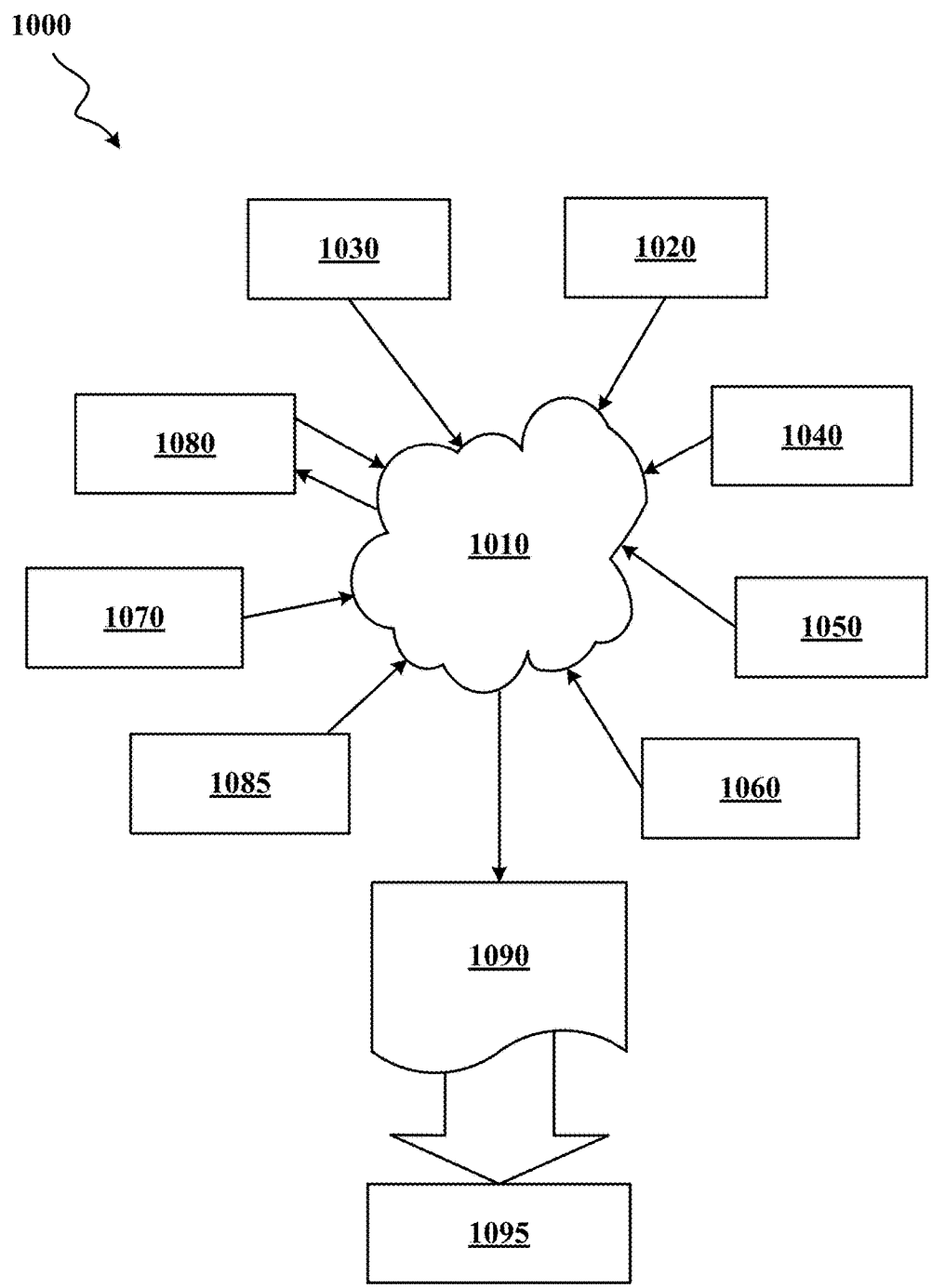
FIG. 10 illustrates multiple design structures including an input design structure that is preferably processed by a design process.

FIG. 10 depicts multiple design structures 1000 including an input design structure 1020 that is preferably processed by a design process, according to embodiments consistent with the figures. Design structure 1020 may be a logical simulation design structure generated and processed by design process 1010 to produce a logically equivalent functional representation of a hardware device. Design structure 1020 may alternatively include data or program instructions that, when processed by design process 1010, generate a functional representation of the physical structure of a hardware device. Whether representing functional or structural design features, design structure 1020 may be generated using electronic computer-aided design, such as that implemented by a core developer/designer. When encoded on a machine-readable data transmission, gate array, or storage medium, design structure 1020 may be accessed and processed by one or more hardware or software modules within design process 1010 to simulate or otherwise functionally represent an electronic component, circuit, electronic or logic module, apparatus, device, or system such as those depicted in FIG. 1-5, or a circuit personalized or modified by the methods described in reference to FIG. 6-9. As such, design structure 1020 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 1010 preferably employs and incorporates hardware or software modules for synthesizing, translating, or otherwise processing a design/simulation functional equivalent of the components, circuits, devices, or logic structures depicted in FIG. 1-5, or a circuit personalized or modified by the methods described in reference to FIG. 6-9, to generate a Netlist 1060 which may contain design structures such as design structure 1020. Netlist 1060 may comprise, for example, compiled or otherwise processed data structures representing a list of wires, discrete components, logic gates, control circuits, I/O devices, models, etc. that describe the connections to other elements and circuits in an integrated circuit design. Netlist 1060 may be synthesized using an iterative process in which Netlist 1060 is resynthesized one or more times depending on design specifications and parameters for the device. As with other design structure types described herein, Netlist 1060 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 1010 may include hardware and software modules for processing a variety of input data structure types including Netlist 1060. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1065 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010, without deviating from the scope and spirit of the disclosure. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures, along with any additional mechanical design or data, to generate a second design structure 1090. Design structure 1090 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that, when processed by an ECAD system, generate a logically or otherwise functionally equivalent form of one or more of the embodiments of the disclosure depicted in FIG. 1-5, or a circuit personalized or modified by the methods described in reference to FIG. 6-9. In one embodiment, design structure 1090 may comprise a compiled, executable HDL simulation model that functionally simulates the devices depicted in FIG. 1-5, or a circuit personalized or modified by the methods described in reference to FIG. 6-9.

Design structure 1090 may also employ a data format used for the exchange of layout data of integrated circuits and/or symbolic data format (e.g., information stored in a GDSII, GL1, OASIS, map files, or any other suitable format for storing such design data structures). Design structure 1090 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and depicted in FIG. 1-5, or a circuit personalized or modified by the methods described in reference to FIG. 6-9. Design structure 1090 may then proceed to a state 1095 where, for example, design structure 1090 proceeds to tape-out, is released to manufacturing, is released to a mask house, is sent to another design house, is sent back to the customer, etc.

Figure 11:
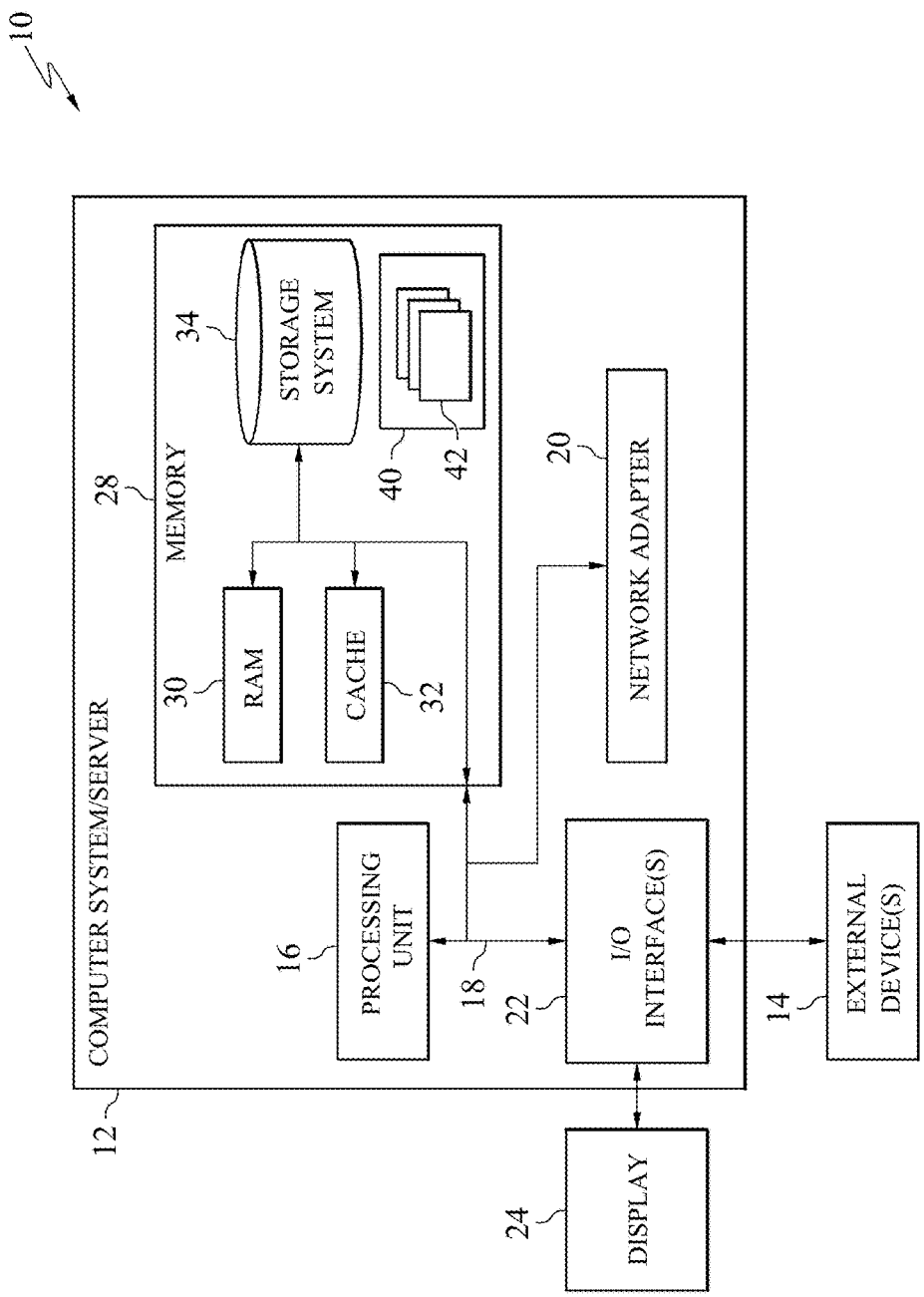
FIG. 11 depicts a computing node according to an embodiment of the present disclosure.

Referring now to FIG. 11, a schematic of an example of a computing node is shown. Computing node 10 is only one example of a suitable computing node and is not intended to suggest any limitation as to the scope of use or functionality of embodiments of the invention described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed computing environments where tasks are performed by remote processing devices that are linked through a communications network. In a distributed computing environment, program modules may be located in both local and remote computer system storage media including memory storage devices.

As shown in FIG. 11, computer system/server 12 in computing node 10 is shown in the form of a general-purpose computing device. The components of computer system/server 12 may include, but are not limited to, one or more processors or processing units 16, a system memory 26, and a bus 16 that couples various system components including system memory 26 to processor 16.

Bus 16 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 26 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 16 by one or more data media interfaces. As will be further depicted and described below, memory 26 may include at least one program product having a set (e.g., at least one) of program modules that are configured to carry out the functions of embodiments of the invention.

Program/utility 40, having a set (at least one) of program modules 42, may be stored in memory 26 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 16. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present disclosure may be a system, a method, a design structure and/or a computer program product. The computer program product may include a computer-readable storage medium (or media) having computer-readable program instructions thereon for causing a processor to carry out aspects of the present disclosure.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the above. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the above. A computer-readable storage medium, as used herein, is not to be construed as being transitory signals per se, such as radio waves or other freely propagating electromagnetic waves, electromagnetic waves propagating through a wave-guide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the FIGS. illustrate the architecture, functionality, and operation of possible implementations of systems, methods, and computer program products according to some embodiments of the present disclosure. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the FIGs. For example, two blocks depicted in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the some embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A one-time programmable (OTP) vertical field-effect transistor (VFET), formed on an integrated circuit (IC) substrate, the OTP VFET including:
   a fin extending away from a top surface of the IC substrate in a direction normal to the top surface of the IC substrate;

a doped layer attached to the top surface of the IC substrate, a portion of the doped layer being in electrically conductive contact with the fin and forming a drain of the OTP VFET;

a dielectric layer formed onto side surfaces of the fin, bottom edges of the dielectric layer being vertically adjacent to first portions of a top surface of the doped layer;

a gate dielectric layer having vertical portions formed onto side surfaces of the dielectric layer, the gate dielectric layer further having horizontal portions formed onto second portions of the top surface of the doped layer that are horizontally adjacent to the first portions of the top surface of the doped layer;

a metal layer formed onto top surfaces of the horizontal portions of the gate dielectric layer and onto side surfaces of the vertical portions of the gate dielectric layer, at least a portion of the metal layer forming a gate of the OTP VFET;

an electrically insulative top spacer layer formed onto top edges of the dielectric layer, of the vertical portions of the gate dielectric layer, and of the metal layer; and a doped structure formed onto and in electrically conductive contact with the top surface of the fin, the doped structure forming a source of the OTP VFET.

2. The OTP VFET of claim 1, wherein at least one of the horizontal portions of the gate dielectric layer has a selected thickness to allow it to, in response to a specified programming voltage being applied between the gate and the drain of the OTP VFET, increase in electrical conductivity by a factor of at least 10.

3. The OTP VFET of claim 2, wherein the selected thickness of at least one of the horizontal portions of the gate dielectric layer is in a range between 1.5 nm and 3.0 nm.

4. The OTP VFET of claim 2, wherein the specified programming voltage is in a range between 1.0 V and 3.0 V.

5. The OTP VFET of claim 2, wherein at least one of the horizontal portions of the gate dielectric layer, located between the bottom edge of the metal layer and the doped layer, has an area in a range between 500 nm$^2$ and 1000 nm$^2$.

6. The OTP VFET of claim 1, wherein the OTP VFET is included within an array of OTP VFETs, the gate of the OTP VFET being electrically connected to a wordline of the array and the source of the OTP VFET being electrically connected to a bitline of the array.

7. The OTP VFET of claim 6, wherein the wordline of the array is accessible through a column selection circuit and the bitline of the array is accessible through a row selection circuit.

8. The OTP VFET of claim 6, wherein a row selection circuit and a column selection circuit are configured to apply, during a programming operation, a specified programming voltage between the gate and the source of the OTP VFET and to apply, during a read operation, a specified read voltage that is less than the specified programming voltage between the gate and the source of the OTP VFET.

9. The OTP VFET of claim 1, wherein the gate dielectric layer includes a material selected from the group consisting of: hafnium oxide, hafnium silicon oxide, hafnium silicon oxynitride, lanthanum oxide, lanthanum aluminum oxide, zirconium oxide, zirconium silicon oxide, zirconium silicon oxynitride, silicon nitride and silicon dioxide.

10. The OTP VFET of claim 1, wherein the doped layer and the doped structure formed onto the top surface of the fin are each heavily doped semiconductors that include dopants in a concentration greater than $1.0 \times 10^{18}$ cm$^{-3}$.

11. The OTP VFET of claim 1, wherein the fin is a lightly doped semiconductor that includes dopants in a concentration less than $1.0 \times 10^{17}$ cm$^{-3}$.

12. The OTP VFET of claim 1, wherein the fin is an undoped semiconductor.

13. The OTP VFET of claim 1, wherein the IC that the OTP VFET is formed on also includes a VFET, the VFET including:

a second fin extending away from the top surface of the IC substrate;

a second portion of the doped layer that is in electrically conductive contact with the second fin and forming a drain of the VFET;

a bottom spacer layer attached to the top surface of the doped layer;

a second dielectric layer formed onto side surfaces of the second fin;

a second gate dielectric layer having vertical portions formed onto side surfaces of the second dielectric layer;

a second metal layer formed onto side surfaces of the vertical portions of the second gate dielectric layer, the second metal layer forming a gate of the VFET;

the electrically insulative top spacer layer further formed onto top edges of the vertical portions of the second gate dielectric layer; and a second doped structure formed onto and in electrically conductive contact with the top surface of the fin, the doped structure forming a source of the VFET.

14. A method for fabricating, on an integrated circuit (IC) substrate having a fin that extends away from a top surface of the IC substrate in a direction normal to the top surface of the IC substrate, a one-time programmable (OTP) vertical field-effect transistor (VFET), the method comprising:

forming, on the top surface of the IC substrate, a drain of the OTP VFET by depositing a doped layer, a portion of the doped layer in electrically conductive contact with the fin;

forming a dielectric layer onto side surfaces of the fin, bottom edges of the dielectric layer being vertically adjacent to first portions of a top surface of the doped layer;

forming a gate dielectric layer by depositing vertical portions of gate dielectric material onto side surfaces of the dielectric layer and by depositing horizontal portions of gate dielectric material onto second portions of the top surface of the doped layer that are horizontally adjacent to the first portions of the top surface of the doped layer;

forming a gate of the OTP VFET by depositing a metal layer onto top surfaces of the horizontal portions of the gate dielectric layer and onto side surfaces of the vertical portions of the gate dielectric layer;

forming an electrically insulative top spacer layer onto top edges of the dielectric layer, of the vertical portion of the gate dielectric layer, and of the metal layer; and creating a source of the OTP VFET by forming a doped structure onto and in electrically conductive contact with the top surface of the fin.

15. The method of claim 14, wherein the gate dielectric layer includes a material selected from the group consisting of: hafnium oxide, aluminum oxide, hafnium dioxide, silicon nitride and silicon dioxide.

16. The method of claim 14, wherein the gate dielectric layer has a thickness in a range between 1.5 nm and 3.0 nm.

17. A method for fabricating, on an integrated circuit (IC) substrate having a fin that extends away from a top surface of the IC substrate in a direction normal to the top surface of the IC substrate, a one-time programmable (OTP) vertical field-effect transistor (VFET), the method comprising:

forming, on the top surface of the IC substrate, a drain of the OTP VFET by depositing a doped layer, a portion of the doped layer in electrically conductive contact with the fin;

depositing, on a top surface of the doped layer, an electrically insulative bottom spacer layer;

forming a dielectric layer by depositing horizontal portions of the dielectric layer onto a top surface of the bottom spacer layer and by depositing vertical portions of the dielectric layer onto side surfaces of the fin;

creating sacrificial spacers by depositing sacrificial spacer material onto side surfaces of the dielectric layer, bottom edges of the sacrificial spacers being vertically adjacent to first portions of a top surface of the dielectric layer;

removing portions of the dielectric layer and of the bottom spacer layer that are outside of an area defined on the doped layer by a combined footprint of the sacrificial spacers and of the vertical portions of the dielectric layer;

removing the sacrificial spacers from the side surfaces of the dielectric layer;

forming horizontal portions of a gate dielectric layer by depositing gate dielectric material onto top surfaces of the horizontal portions of the dielectric layer and onto the top surface of the doped layer and forming vertical portions of the gate dielectric layer by depositing the gate dielectric material onto side surfaces of the bottom spacer layer and onto side surfaces of the dielectric layer;

forming a gate of the OTP VFET by depositing a metal layer onto top surfaces of the horizontal portions of the gate dielectric layer and onto side surfaces of the vertical portions of the gate dielectric layer;

forming an electrically insulative top spacer layer onto top edges of the dielectric layer, of at least one of the vertical portions of the gate dielectric layer, and of the metal layer; and creating a source of the OTP VFET by forming a doped structure onto and in electrically conductive contact with the top surface of the fin.

18. The method of claim 17, wherein the sacrificial spacer material includes a material selected from the group consisting of: amorphous carbon, amorphous silicon, polycrystalline silicon and titanium nitride.

19. The method of claim 17, wherein the gate dielectric layer includes a material selected from the group consisting of: hafnium oxide, aluminum oxide, hafnium dioxide, silicon nitride and silicon dioxide.

20. The method of claim 17, wherein the gate dielectric layer has a thickness in a range between 1.5 nm and 3.0 nm.

* * * * *